US009502094B2

(12) United States Patent
Onuki

(10) Patent No.: US 9,502,094 B2
(45) Date of Patent: Nov. 22, 2016

(54) METHOD FOR DRIVING MEMORY ELEMENT

(71) Applicant: Semiconductor Energy Laboratory Co., Ltd., Atsugi-shi, Kanagawa-ken (JP)

(72) Inventor: Tatsuya Onuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 271 days.

(21) Appl. No.: 13/892,479

(22) Filed: May 13, 2013

(65) Prior Publication Data

US 2013/0314976 A1 Nov. 28, 2013

(30) Foreign Application Priority Data

May 25, 2012 (JP) ................. 2012-119709

(51) Int. Cl.
*G11C 11/40* (2006.01)
*G11C 14/00* (2006.01)
(Continued)

(52) U.S. Cl.
CPC .......... *G11C 11/40* (2013.01); *G11C 14/0063* (2013.01); *H01L 27/1108* (2013.01); *H01L 27/1225* (2013.01)

(58) Field of Classification Search
CPC ............ G11C 14/0054; G11C 11/412; G11C 14/0072; G11C 11/40; G11C 14/0063; H01L 27/1225; H01L 27/1108
USPC ........................................ 365/149, 154, 188
See application file for complete search history.

(56) References Cited

U.S. PATENT DOCUMENTS 5,528,032 A 6/1996 Uchiyama
5,731,856 A 3/1998 Kim et al.
5,744,864 A 4/1998 Cillessen et al.
(Continued)

FOREIGN PATENT DOCUMENTS

EP 1 737 044 A1 12/2006
EP 2 226 847 A2 9/2010
(Continued)

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center, with English translation.

(Continued)

*Primary Examiner* — Douglas King
(74) *Attorney, Agent, or Firm* — Fish & Richardson P.C.

(57) ABSTRACT

To provide a memory element which keeps a stored logic state even without supply of power. To increase an effect of reducing power consumption by facilitating stop of supply of power to the memory element for a short time. Data (potential) held in a node in a logic circuit can be swiftly saved on a node where one of a source and a drain of the transistor and one electrode of the capacitor included in a memory circuit are connected by lowering a potential of the other electrode of a capacitor before a transistor is turned on. By making a potential of the other electrode of the capacitor when the transistor is in an off state higher than a potential of the other electrode of the capacitor when the transistor is in an on state, a potential of the node can be reliably held even without supply of power.

13 Claims, 14 Drawing Sheets

(51) Int. Cl.
*H01L 27/11* (2006.01)
*H01L 27/12* (2006.01)

(56) References Cited

U.S. PATENT DOCUMENTS

| | | | |
|---|---|---|---|
| 6,285,575 B1* | 9/2001 | Miwa | 365/145 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,924,999 B2 | 8/2005 | Masui | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,422,298 B2 | 4/2013 | Saito et al. | |
| 8,614,910 B2 | 12/2013 | Shionoiri | |
| 8,711,623 B2 | 4/2014 | Saito et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0190597 A1 | 9/2005 | Kato | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2012/0271984 A1 | 10/2012 | Ohmaru et al. | |
| 2012/0294068 A1 | 11/2012 | Ishizu | |
| 2012/0294102 A1 | 11/2012 | Ishizu | |
| 2013/0175627 A1* | 7/2013 | Goldbach | H01L 27/1104 257/350 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 10-078836 A | 3/1998 |
| JP | 11-505377 A | 5/1999 |
| JP | 2000-044236 A | 2/2000 |
| JP | 2000-077982 A | 3/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-092922 A | 4/2005 |
| JP | 2005-276253 A | 10/2005 |
| JP | 2005-303990 A | 10/2005 |
| JP | 2011-216177 A | 10/2011 |
| JP | 2012-048807 A | 3/2012 |
| WO | 2004/114391 A1 | 12/2004 |
| WO | WO-2011/114866 | 9/2011 |

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(56) References Cited

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg—Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

(56) References Cited

OTHER PUBLICATIONS

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m>4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

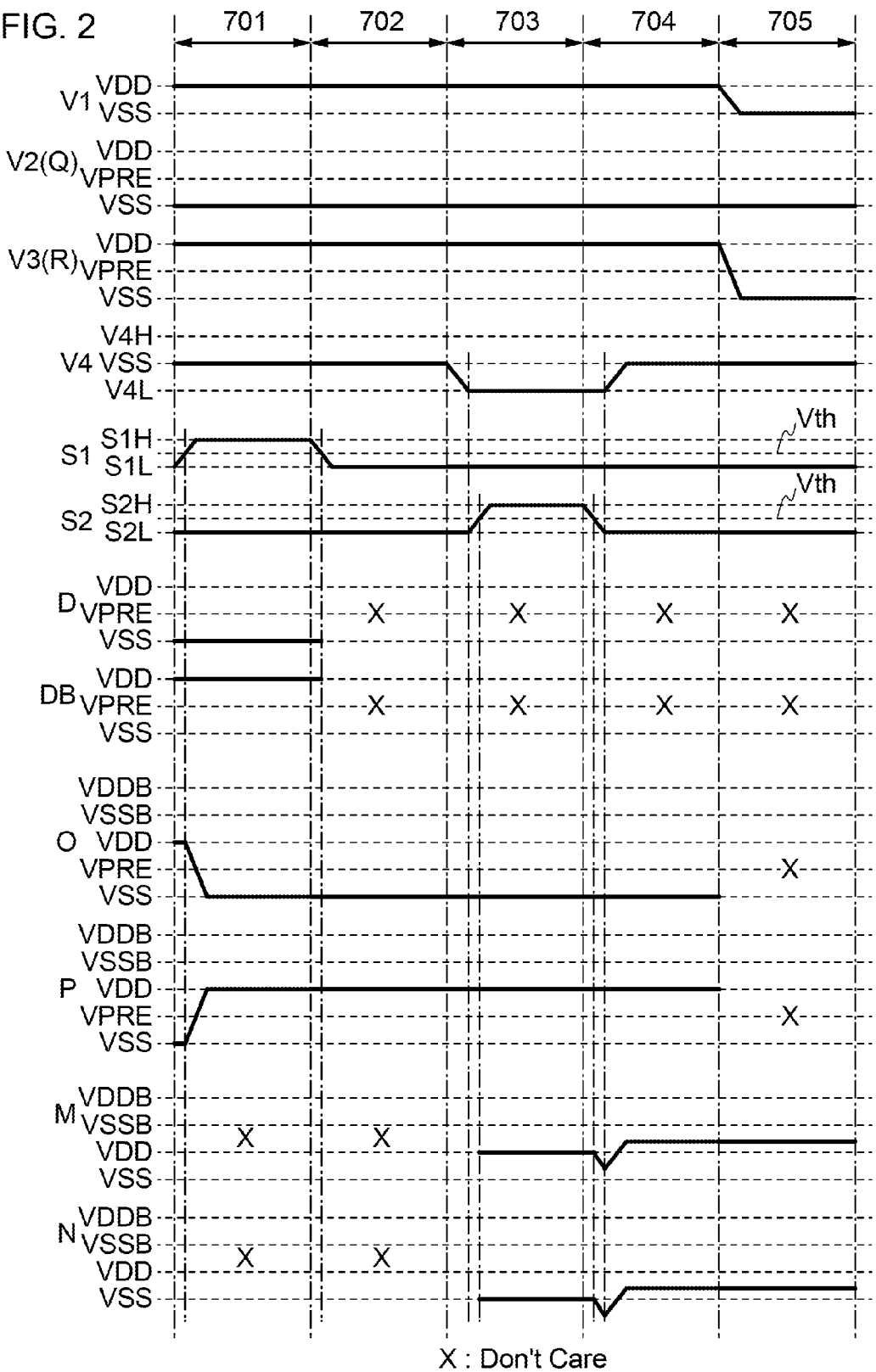

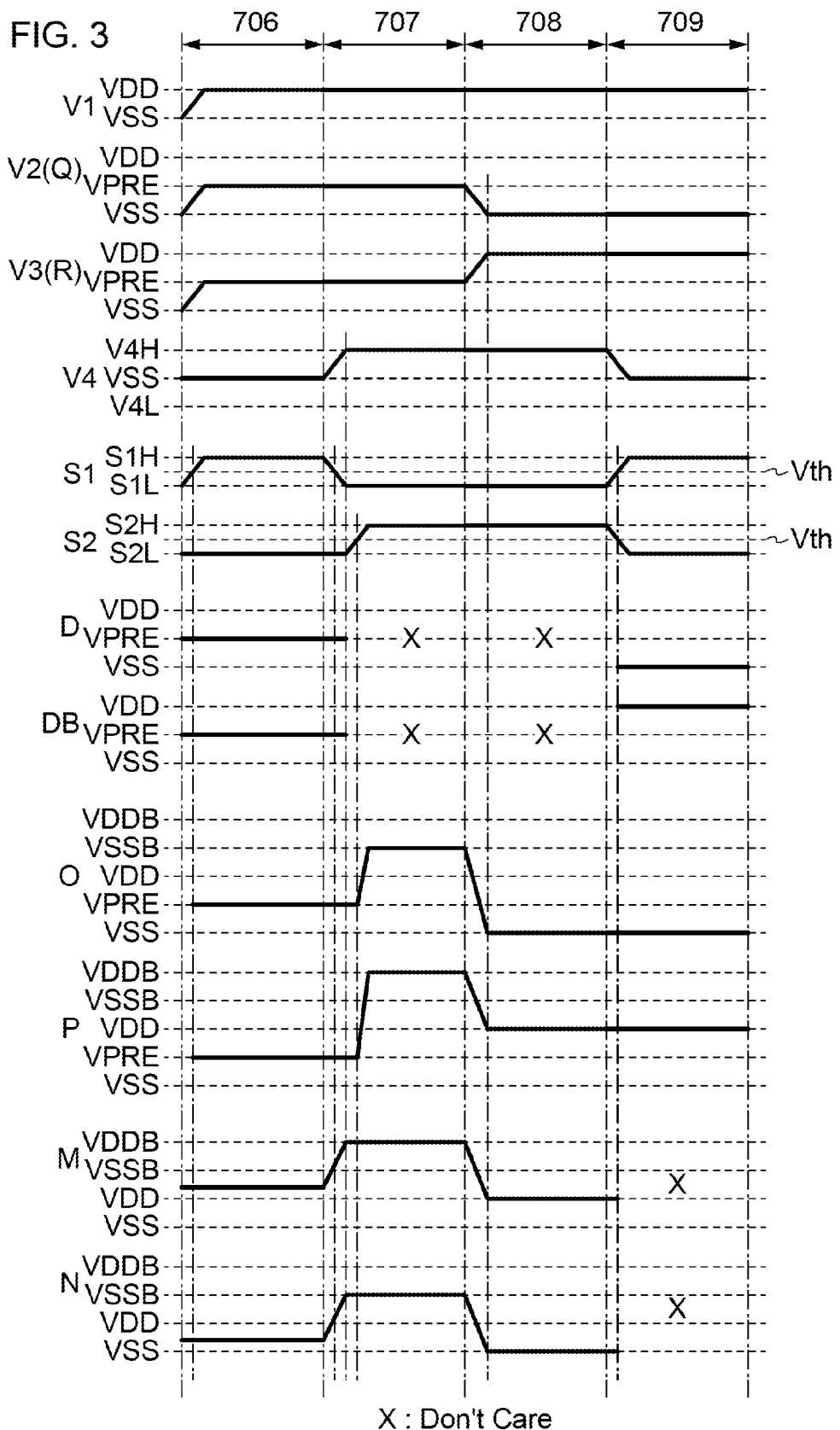

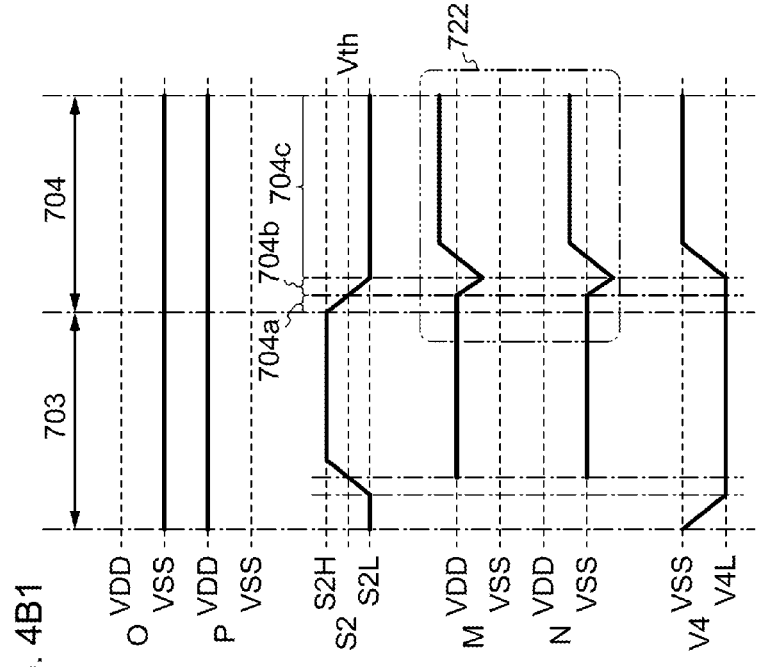
FIG. 4A1
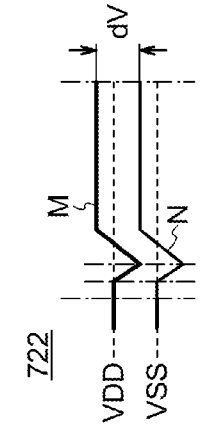
FIG. 4A2
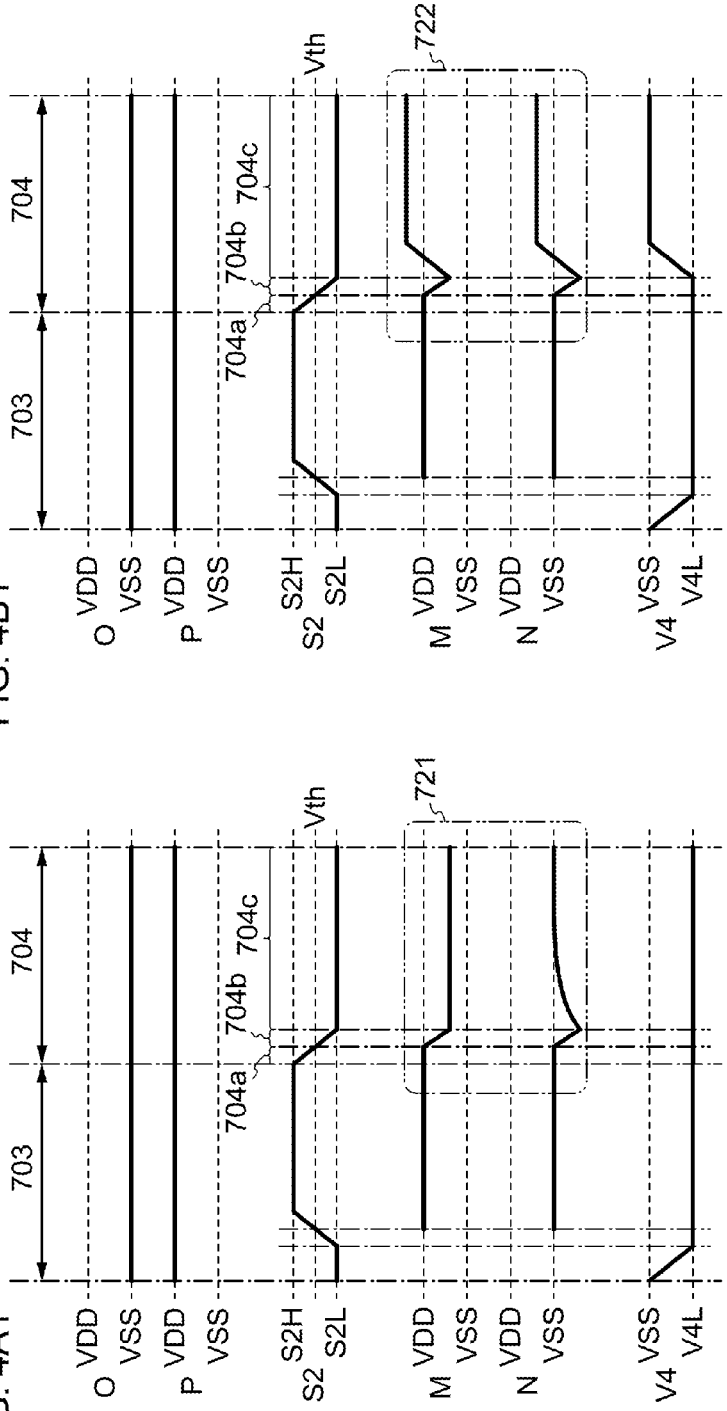
FIG. 4B1
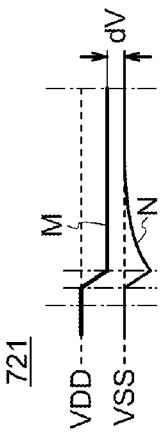
FIG. 4B2

METHOD FOR DRIVING MEMORY ELEMENT

BACKGROUND OF THE INVENTION

1. Field of the Invention

The present invention relates to a memory element, a memory device utilizing the memory element, a manufacturing method thereof, and a driving method thereof. Further, the present invention relates to a signal processing circuit including the memory element or the memory device. Further, the present invention relates to a semiconductor device including the memory element or the memory device.

Note that a semiconductor device in this specification and the like refers to any device that can function by utilizing semiconductor characteristics, and for example, electro-optical devices, memory devices, signal processing circuits, semiconductor circuits, and electronic devices are all semiconductor devices.

2. Description of the Related Art

In recent years, with the widespread use of electronic devices such as personal computers and mobile phones, demand for higher performance of electronic devices has been increased. In order to achieve higher performance of such electronic devices, higher performance of memories has been particularly required in addition to higher-speed operation of interfaces, improvement in processing performance of external devices, and the like.

The "memory" (memory device) used here includes, in its category, not only a main memory for storing data and program but also a register, a cache memory, and the like used in a signal processing circuit such as a central processing unit (CPU). A register is provided to temporarily hold data for carrying out arithmetic processing, holding a program execution state, or the like. In addition, a cache memory is located between an arithmetic circuit and a main memory in order to reduce access to the low-speed main memory and speed up the arithmetic processing. In a memory device such as a register or a cache memory, writing of data needs to be performed at higher speed than in a main memory. Thus, in general, a flip-flop or the like is used as a register, and a volatile memory circuit such as a static random access memory (SRAM) is used as a cache memory.

In order to reduce consumed power, a method for temporarily stopping the supply of power to a signal processing circuit in a period during which data is not input and output has been suggested. In the method, a nonvolatile memory circuit is located around a volatile memory circuit such as a register or a cache memory, so that the data is temporarily stored in the nonvolatile memory circuit. Thus, in the signal processing circuit, the data signal stored in the register, the cache memory, or the like can be held even while the supply of power is stopped (for example, see Patent Document 1).

In addition, in the case where the supply of power is stopped in a signal processing circuit for a long time, data in a volatile memory circuit may be transferred to an external memory device such as a hard disk or a flash memory before the supply of power is stopped, in which case the data can be prevented from being erased.

REFERENCE

[Patent Document 1] Japanese Published Patent Application No. H10-078836

SUMMARY OF THE INVENTION

In such a signal processing circuit disclosed in Patent Document 1, in the case of using a method for storing data of a volatile memory circuit in an external memory device while supply of power is stopped, it takes time to restore data from the external memory device to the volatile memory circuit after the supply of power is restarted. Therefore, such a signal processing circuit is not suitable in the case where the power supply is stopped for a short time so as to reduce power consumption.

In view of the above problem, an object of one embodiment of the present invention is to provide a memory element which can keep a stored logic state even when the supply of power is stopped or a memory device using the memory element.

An object of one embodiment of the present invention is to provide a memory element in which supply of power can be stopped for a short time with ease or a memory device using the memory element.

In addition, another object of one embodiment of the present invention is to provide a semiconductor device having power consumption reduced by using the memory element or the memory device.

A memory element according to one embodiment of the present invention includes a logic circuit and a memory circuit. The memory circuit includes a transistor and a capacitor.

A logic value which a non-selected logic circuit has is held in the memory circuit and supply of power to the non-selected logic circuit is stopped; thus, power consumption of the memory element can be low.

Note that the phrase "supply of power is stopped" in this specification means the following cases: the case where electrical continuity of part or the whole of a wiring for supplying power from a power source to a semiconductor device is broken to prevent supply of power from the power source to the semiconductor device; and the case where power is not consumed in practice even when any signal is input to a semiconductor device because all of the wirings for supplying power from a power source to the semiconductor device are made to be substantially equipotential.

One embodiment of the present invention is a memory element which includes a logic circuit configured to hold different potentials in a first node and a second node; a first memory circuit comprising a first transistor and a first capacitor; a second memory circuit comprising a second transistor and a second capacitor. One of a source and a drain of the first transistor is connected to the first node. The other of the source and the drain of the first transistor and one electrode of the first capacitor are connected to a third node. One of a source and a drain of the second transistor is connected to the second node. The other of the source and the drain of the second transistor and one electrode of the second capacitor are connected to a fourth node. A gate of the first transistor and a gate of the second transistor are connected to a first wiring. The other electrode of the first capacitor and the other electrode of the second capacitor are connected to a second wiring.

In a first period, a potential at which the first transistor and the second transistor are turned on is supplied to a first wiring, the potential of the first node is supplied to the third node, the potential of the second node is supplied to the fourth node, and a first bias potential is supplied to a second wiring. In a second period, a potential at which the first transistor and the second transistor are turned off is supplied to the first wiring and then a second bias potential is supplied to the second wiring. In a third period, supply of power to the logic circuit is stopped.

The first bias potential is preferably lower than the second bias potential.

In the case where the potential of the first node is supplied to the third node, the potential of the other electrode of the first capacitor is set to the first bias potential. After the first transistor is turned off, the potential of the other electrode of the first capacitor is set to the second bias potential. As a result, a potential (electric charge) held in the third node is prevented from leaking to the first node. Therefore, data written in the first memory circuit can be held for a long time.

In the case where the potential of the second node is supplied to the fourth node, the potential of the other electrode of the second capacitor is set to the first bias potential. After the second transistor is turned off, the potential of the other electrode of the first capacitor is set to the second bias potential. As a result, a potential (electric charge) held in the fourth node is prevented from leaking to the second node. Therefore, data written in the second memory circuit can be held for a long time.

That is, a potential difference between the third node of the first memory circuit and the fourth node of the second memory circuit can be held for a long time. A small potential difference between the third node and the fourth node in the memory circuits makes data held in the memory circuits difficult to be restored to the logic circuit. However, according to one embodiment of the present invention, data written to the memory circuit can be surely restored to the logic circuit before stop of supply of power; as a result, reliability of the memory element can be improved.

In one embodiment of the present invention, while the second bias potential is supplied to the second wiring and supply of power to the logic circuit is stopped, the third bias potential is supplied to the second wiring in the fourth period. After that, a potential at which the first transistor and the second transistor are turned on is supplied to the first wiring, the potential of the third node is supplied to the first node, and the potential of the fourth node is supplied to the second node. In the fifth period, supply of power to the logic circuit starts.

It is preferable to use an oxide semiconductor for the semiconductor layer in which a channel is formed and which is in the transistor included in the memory circuit. In addition, the first bias potential is preferably lower than the second bias potential and the second bias potential is preferably lower than the third bias potential.

Further, a period where a precharge potential is supplied to the first node and the second node is preferably provided before the fourth period. In other words, before the first transistor and the second transistor are turned on in the fourth period, a precharge potential is preferably supplied to the first node and the second node. Any potential can be used as a precharge potential; however, for example, in the case where $V_{DD}$ and $V_{SS}$ are supplied in a later step as power for the logic circuit, a precharge potential is preferably a middle potential between $V_{DD}$ and $V_{SS}$ (i.e., $(V_{DD}+V_{SS})/2$).

The first transistor included in the first memory circuit is preferably an enhancement-mode transistor. The second transistor included in the second memory circuit is preferably an enhancement-mode transistor.

In addition, in a memory element according to one embodiment of the present invention, an operation for stopping supply of power and an operation for resuming supply of power are performed at high speed; therefore, stop of supply of power for a short time can be easily performed. As a result, power consumption of a semiconductor device using the memory element can be efficiently reduced.

According to one embodiment of the present invention, a memory element which can keep a stored logic state even when the supply of power is stopped or a memory device using the memory element can be provided.

According to one embodiment of the present invention, a driving method for increasing the speed of an operation of stopping supply of power to the memory element can be provided. Further, a driving method for increasing the speed of an operation of resuming supply of power to the memory element can be provided. As a result, a memory element which facilitates stop of supply of power for a short time or a memory device using the memory element can be provided.

A semiconductor device having reduced power consumption by using the memory element or the memory device can be provided.

BRIEF DESCRIPTION OF THE DRAWINGS

FIG. 2 is a timing diagram showing the operation of a memory device.

FIG. 3 is a timing diagram showing the operation of a memory device.

FIGS. 4A1, 4A2, 4B1, and 4B2 are timing diagrams showing the operation of a memory device.

DETAILED DESCRIPTION OF THE INVENTION

Figure 1A:
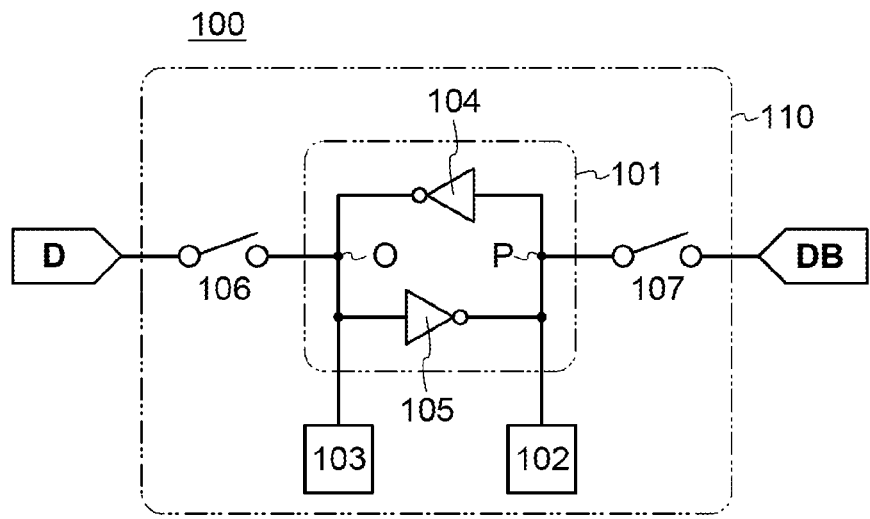
FIGS. 1A and 1B are circuit diagrams of a memory device.

Embodiments of the present invention will be described below with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

Note that functions of the "source" and "drain" may be switched in the case where transistors of different conductivity types are employed or in the case where the direction of a current flow changes in a circuit operation, for example. Therefore, the terms "source" and "drain" can be used to denote the drain and the source, respectively, in this specification.

A voltage refers to a potential difference between a given potential and a reference potential (e.g., a ground potential) in many cases. Accordingly, voltage, potential, and a potential difference can be referred to as potential, voltage, and a voltage difference, respectively, in this specification.

In this specification and the like, the terms "over" and "below" do not necessarily mean "directly on" and "directly below", respectively, in the description of a physical relationship between components. For example, the expression "a gate electrode over a gate insulating layer" can mean the case where there is an additional component between the gate insulating layer and the gate electrode.

The position, size, range, or the like of each component illustrated in drawings and the like is not accurately represented in some cases for easy understanding. Therefore, the disclosed invention is not necessarily limited to the position, size, range, or the like as disclosed in the drawings and the like.

The ordinal number such as "first", "second", and "third" are used in order to avoid confusion among components.

Embodiment 1

Figure 1B:
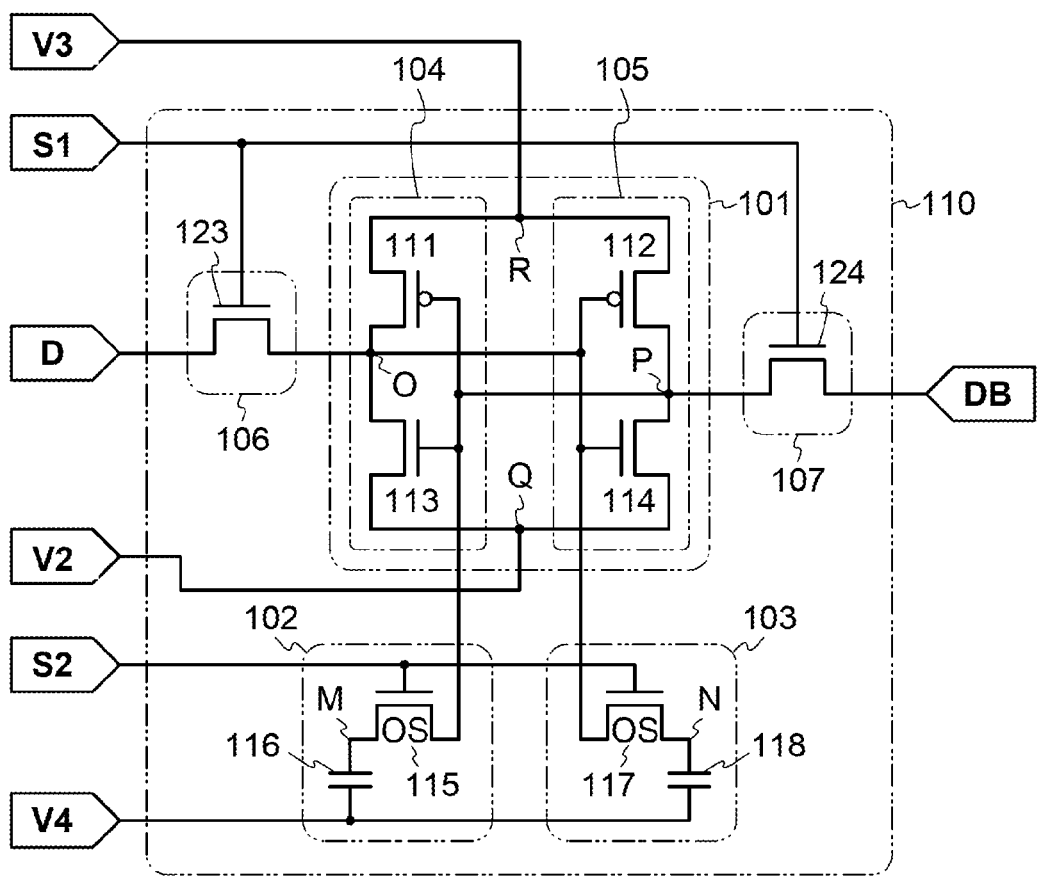

A memory element 110 according to one embodiment of the present invention will be described with reference to FIGS. 1A and 1B. FIGS. 1A and 1B are circuit diagrams showing the circuit configuration of the memory element 110. In FIG. 1A, part of the circuit configuration in FIG. 1B is replaced with logic symbols. Note that in each of circuit diagrams, in some cases, "OS" (abbreviation of an oxide semiconductor) is written besides a transistor in order to indicate that the transistor includes an oxide semiconductor.

The memory element 110 illustrated in FIGS. 1A and 1B includes a logic circuit 101, a memory circuit 102, a memory circuit 103, a switch 106, and a switch 107. Further, the logic circuit 101 includes a first inverter circuit 104 and a second inverter circuit 105. The first inverter circuit 104 includes a p-channel transistor 111 and an n-channel transistor 113. The second inverter circuit 105 includes a p-channel transistor 112 and an n-channel transistor 114.

The logic circuit 101 illustrated in this embodiment as an example functions as a flip flop having bistable state, in which an output signal of the first inverter circuit 104 is input to the second inverter circuit 105 and an output signal of the second inverter circuit 105 is input to the first inverter circuit 104.

A node where an output terminal of the first inverter circuit 104 and an input terminal of the second inverter circuit 105 are electrically connected to each other is referred to as a node O. A node where an input terminal of the first inverter circuit 104 and an output terminal of the second inverter circuit 105 are electrically connected to each other is referred to as a node P. A node where one of a source and a drain of the transistor 113 and one of a source and a drain of the transistor 114 are electrically connected to each other is referred to as a node Q. A node where one of a source and a drain of the transistor 111 and one of a source and a drain of the transistor 112 are electrically connected to each other is referred to as a node R. A second potential V2 and a third potential V3 are input to the nodes Q and R, respectively.

For example, a potential $V_{SS}$ (hereinafter, also simply referred to as "$V_{SS}$") which is a low power source potential is input as the second potential V2, and a potential $V_{DD}$ (hereinafter, also simply referred to as "$V_{DD}$") which is a high power source potential is input as the third potential V3. In addition, a ground potential can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

The switch 106 includes a transistor 123. A first terminal of the switch 106 corresponds to one of a source and a drain of the transistor 123, a second terminal thereof corresponds to the other of the source and the drain of the transistor 123, and a third terminal thereof (not illustrated) corresponds to a gate of the transistor 123. The first terminal of the switch 106 is connected to the node O of the logic circuit 101. Data D is input to the second terminal of the switch 106.

The switch 107 includes a transistor 124. A first terminal of the switch 107 corresponds to one of a source and a drain of the transistor 124, a second terminal thereof corresponds to the other of the source and the drain of the transistor 124, and a third terminal thereof (not illustrated) corresponds to a gate of the transistor 124. The first terminal of the switch 107 is connected to the node P of the logic circuit 101. Data DB is input to the second terminal of the switch 107.

In this embodiment, the case where n-channel transistors are used as the switches 106 and 107 is described; however, a p-channel transistor may be used for one or both of the switches 106 and 107. Alternatively, a combination of an n-channel transistor and a p-channel transistor may be used for each of the switches 106 and 107. For example, an analog switch including a combination of an n-channel transistor and a p-channel transistor may be applied to the switch 106. The same can be applied to the switch 107.

A control signal S1 is input to the third terminal of the switch 106 and the third terminal of the switch 107. With the control signal S1 input to the third terminal of the switch 106, conduction or non-conduction between the first terminal and the second terminal of the switch 106 (on or off state of the transistor 123) is selected. Similarly, with the control signal S1 input to the third terminal of the switch 107, conduction or non-conduction between the first terminal and the second terminal of the switch 107 (on or off state of the transistor 124) is selected.

The memory circuit 102 includes a transistor 115 and a capacitor 116. Here, one of a source and a drain of the transistor 115 is connected to the node P of the logic circuit 101, and the other of the source and the drain of the transistor 115 is connected to one of a pair of electrodes of the capacitor 116. A node where the transistor 115 and the capacitor 116 are connected to each other is referred to as a node M.

The memory circuit 103 includes a transistor 117 and a capacitor 118. Here, one of a source and a drain of the transistor 117 is connected to the node O of the logic circuit 101, and the other of the source and the drain of the transistor 117 is connected to one of a pair of electrodes of the capacitor 118. A node where the transistor 117 and the capacitor 118 are connected to each other is referred to as a node N.

A control signal S2 is input to gates of the transistors 115 and 117. A fourth potential V4 is input to the other of the pair of the electrodes of each of the capacitors 116 and 118.

With the control signal S2 input to a gate of the transistor 115, conduction or non-conduction between the source and the drain of the transistor 115 (on or off state of the transistor 115) is selected. Similarly, with the control signal S2 input to a gate of the transistor 117, conduction or non-conduction between the source and the drain of the transistor 117 (on or off state of the transistor 117) is selected.

Here, the transistor 115 and the transistor 117 each preferably have low off-state current. Specifically, off-state current per micrometer in channel width is lower than or equal to 100 zA, preferably lower than or equal to 10 zA. As the transistor with low off-state current, it is preferable to use a transistor in which a channel is formed in a layer or a substrate formed using a semiconductor with a larger band gap than silicon. As an example of a semiconductor with a band gap of greater than or equal to 2 eV, preferably greater than or equal to 2.5 eV, more preferably greater than or equal to 3 eV, an oxide semiconductor can be given. A transistor in which a channel is formed in an oxide semiconductor has a characteristic of extremely low off-state current.

In this embodiment, a transistor where a channel is formed in an oxide semiconductor is used as the transistors 115 and 117. Therefore, when a transistor whose channel is formed in an oxide semiconductor is used as the transistor 115, a potential of the node M can be kept for a long time with the transistor 115 being in an off state. Similarly, when a transistor whose channel is formed in an oxide semiconductor is used as the transistor 117, a potential of the node N can be kept for a long time with the transistor 117 being in an off state.

In the case where an In—Sn—Zn-based oxide is used as an oxide semiconductor material, the field-effect mobility of the transistor can be 30 cm$^2$/Vsec or higher, preferably 40 cm$^2$/Vsec or higher, more preferably 60 cm$^2$/Vsec or higher, so that the memory circuit 102 and the memory circuit 103 can operate at high speed.

In this embodiment, the transistors 111 and 112 are p-channel transistors, and the transistors 113, 114, 115, 117, 123, and 124 are n-channel transistors; however, this embodiment is not limited thereto and the conductivity types of the transistors can be determined as appropriate.

<Method for Driving Memory Element>

Next a method for driving the memory element 110 illustrated in FIGS. 1A and 1B will be described with reference to timing diagrams in FIG. 2, FIG. 3, and FIGS. 4A1, 4A2, 4B1, and 4B2. Note that the potential of a main power source of a memory device 100 including the memory element 110 is set to a first potential V1.

In the timing diagrams in FIG. 2, FIG. 3, and FIGS. 4A1, 4A2, 4B1, and 4B2, V1 represents a first power source potential V1 (a main power supply); V2, the second potential V2; V3, the third potential V3; V4, the fourth potential V4; S1, a potential of the control signal S1; S2, a potential of the control signal S2; O, a potential of the node O of the logic circuit 101; P, a potential of the node P of the logic circuit 101; Q, a potential of the node Q; R, a potential of the node R; M, a potential of the node M; N, a potential of the node N; D, a potential of data D; and DB, a potential of data DB.

In this embodiment, the case where a high-level potential is applied to the logic circuit 101 as the data D and a low-level potential is applied to the logic circuit 101 as the data DB is described. However, it is possible to apply a low-level potential to the logic circuit 101 as the data D and a high-level potential to the logic circuit 101 as the data DB.

Further, in this embodiment, a high-level potential and a low-level potential applied to the logic circuit 101 as the data D and the data DB are set to $V_{DD}$ and $V_{SS}$, respectively. Note that a high-level potential means a potential higher than a low-level potential and is not limited to $V_{DD}$. A low-level potential means a potential lower than a high-level potential and is not limited to $V_{SS}$.

In addition, in this embodiment, a precharge potential $V_{PRE}$ is described as the middle potential between $V_{DD}$ and $V_{SS}$ (i.e., $(V_{DD}+V_{SS})/2$); however, the precharge potential $V_{PRE}$ is not limited thereto. For example, the precharge potential $V_{PRE}$ may be higher than or equal to $V_{SS}$ and lower than or equal to $V_{DD}$. Alternatively, the precharge potential $V_{PRE}$ may be lower than $V_{SS}$ or higher than $V_{DD}$.

A period 701 is a period for writing data to the logic circuit 101. After $V_{DD}$ is supplied as the first potential V1, $V_{SS}$ is supplied as the second potential V2, and $V_{DD}$ is supplied as the third potential V3, a high-level potential S1H is supplied as the control signal S1 (see FIG. 2).

The high-level potential S1H is a potential for turning on the transistors 123 and 124. The transistors 123 and 124 are n-channel transistors in this embodiment; therefore, the high-level potential S1H may be sufficiently higher than threshold voltages $V_{th}$ (hereinafter also simply referred to as "$V_{th}$") of the transistors 123 and 124. For example, the high-level potential S1H may be $V_{DD}$.

Note that a low-level potential S1L is a potential for turning off the transistors 123 and 124. The transistors 123 and 124 are n-channel transistors in this embodiment; therefore, the low-level potential S1L may be sufficiently lower than $V_{th}$ of the transistors 123 and 124. For example, the low-level potential S1L may be $V_{SS}$.

When the high-level potential S1H is supplied as the control signal S1, the first terminal and the second terminal of the switch 106 become a conduction state to supply the potential of the data D to the node O. Further, the first terminal and the second terminal of the switch 107 become a conduction state to supply the potential of the data DB to the node P. At this time, in the case where a potential difference between the potential of the data D ($V_{DD}$) and the high-level potential S1H is lower than $V_{th}$, a potential lower than $V_{DD}$ might be supplied to the node O. Note that when $V_{SS}$ is supplied to the node P, $V_{DD}$ is output from the first inverter circuit 104; thus, the potential of the node O immediately becomes $V_{DD}$.

The operation of the first inverter circuit 104 can be described as follows. When $V_{SS}$ is supplied to the input terminal of the first inverter circuit 104 (the node P), $V_{SS}$ is also supplied to a gate of the p-channel transistor 111 and a gate of the n-channel transistor 113. At this time, the potential of the node Q which is equal to as the potential of the source of the transistor 113 is $V_{SS}$, and therefore, a potential difference does not occur between the gate and the source of the transistor 113; accordingly, the transistor 113 is turned off. Further, the potential of the node R which is equal to as the potential of the source of the transistor 111 is $V_{DD}$, and therefore, a relatively negative voltage is applied to the gate of the transistor 111; accordingly, the transistor 111 is turned on. As a result, conduction is established between the nodes R and O, whereby $V_{DD}$ is output from the first inverter circuit 104. Note that when $V_{DD}$ is supplied to the input terminal of the first inverter circuit 104, the transistor 111 is turned off and the transistor 113 is turned on; as a result, $V_{SS}$ is output. In addition, the operation of the second inverter circuit 105 can also be described in a manner similar to that of the first inverter circuit 104.

Further, in the period 701, the control signal S2 may be either a high-level potential S2H or a low-level potential S2L.

The high-level potential S2H is a potential for turning on the transistors 115 and 117. In this embodiment, the transistors 115 and 117 are n-channel transistors. Accordingly, the high-level potential S2H may be sufficiently higher than $V_{th}$ of the transistors 115 and 117. Further, the high-level potential S2H is preferably a higher $V_{th}$ between $V_{th}$ of the transistor 117 and $V_{th}$ of the transistor 115 as the total potential of a high-level potential supplied to the node O or P and.

The low-level potential S2L is a potential for turning off the transistors 115 and 117. In this embodiment, the transistors 115 and 117 are n-channel transistors. Accordingly, the low-level potential S2L may be sufficiently lower than $V_{th}$ of the transistors 115 and 117. In this embodiment, the low-level potential S2L is set to be $V_{SS}$.

Note that the period 701 is a period where data is written to the logic circuit 101 and data held in the logic circuit 101 is rewritten. In such a period, high-speed operation is needed. In the case where the high-level potential S2H is supplied to the memory element 110 as the control signal S2, the potentials of the data D and the data DB (the potentials of the nodes O and P) are supplied also to the memory circuits 102 and 103. In this case, the speed of writing operation becomes low and power consumption is increased. Therefore, in the period 701, the low-level potential S2L is preferably supplied as the control signal S2 to prevent the potentials from being supplied to the memory circuits 102 and 103. In this embodiment, the control signal S2 in the period 701 is the low-level potential S2L.

Note that the fourth potential V4 in the period 701 may be any potential. In FIG. 2, the fourth potential V4 in the period 701 is set to be $V_{SS}$.

A period 702 is a period where the data written to the logic circuit 101 is held in the nodes O and P. The data is held in such a manner that the low-level potential S1L is supplied to the gates of the transistors 123 and 124 as the control signal S1 to turn off the transistors 123 and 124. When the transistor 123 is turned off, the first terminal and the second terminal of the switch 106 become a non-conduction state. When the transistor 124 is turned off, the first terminal and the second terminal of the switch 107 become a non-conduction state (see FIG. 2).

In the period 702, the data is held in the nodes O and P while power is supplied to the logic circuit 101. Thus, the data held in the logic circuit 101 can be rewritten and can be read at high speed when needed.

A period 703 is a period where the data written in the nodes O and P is saved on the memory circuits 102 and 103 before the supply of power to the logic circuit 101 is stopped. In the period 703, the high-level potential S2H is supplied to the gates of the transistors 115 and 117 as the control signal S2, whereby the transistors 115 and 117 are turned on. Thus, the data held in the node O in the logic circuit 101 and the data held in the node P in the logic circuit 101 are supplied to the nodes N and M, respectively. Note that as the fourth potential V4, a high-level potential V4H, a low-level potential V4L, or $V_{SS}$ is supplied (see FIG. 2).

The high-level potential V4H is a potential higher than $V_{SS}$. The low-level potential V4L is lower than $V_{SS}$. Further, the high-level potential V4H is preferably higher than or equal to the total potential of $V_{SS}$ and a higher $V_{th}$ between $V_{th}$ of the transistor 117 and $V_{th}$ of the transistor 115. In addition, the low-level potential V4L is preferably a potential obtained from subtracting a higher $V_{th}$ between $V_{th}$ of the transistor 117 and $V_{th}$ of the transistor 115 from $V_{SS}$.

In this embodiment, the low-level potential V4L is supplied as the fourth potential V4. In addition, the low-level potential V4L is preferably supplied before supply of the high-level potential S2H, in which case the potentials of the nodes N and M can be lower than the potentials of the nodes O and P, respectively. Accordingly, potential differences between the nodes O and N and between the nodes P and M are large, and therefore, data can be written to the nodes N and M at high speed.

In this embodiment, $V_{DD}$ and $V_{SS}$ are written to the nodes M and N, respectively.

Alternatively, the operation in the period 703 and the operation in the period 702 may be performed in combination concurrently. The data held in the node O and the data held in the node P are saved on the memory circuits 102 and 103, respectively, in the period 702 where the data written to the logic circuit 101 is held in the nodes O and P; accordingly, the period 703 can be removed. As a result, the operation speed of the memory element 110 can be increased.

A period 704 is a period where the data written to the memory circuits 102 and 103 is held. In the period 704, the low-level potential S2L is supplied to the gates of the transistors 115 and 117 as the control signal S2 to turn off the transistors 115 and 117; then, the fourth potential V4 is set to be $V_{SS}$ to prevent change in the potentials of the nodes M and N (see FIG. 2).

Here, the operation in the period 704 will be described in detail with reference to FIGS. 4A1, 4A2, 4B1, and 4B2 and FIGS. 5A and 5B. FIG. 4A1 is a timing diagram in the case where in the period 704, after the control signal S2 becomes the low-level potential S2L, the fourth potential V4 remains to be the low-level potential V4L. FIG. 4A2 is a timing diagram of a part 721 in FIG. 4A1, in which changes in the potentials of the nodes M and N are shown. FIG. 4B1 is a timing diagram in the case where in the period 704, after the control signal S2 becomes the low-level potential S2L, the fourth potential V4 is set to be $V_{SS}$. FIG. 4B2 is a timing diagram of a part 722 in FIG. 4B1, in which changes in the nodes M and N are shown. In addition, "$V_{th}$" in FIGS. 4A1 and 4B1 is $V_{th}$ of the transistors 115 and 117. Note that for simple description, $V_{th}$ of the transistor 115 and $V_{th}$ of the transistor 117 are assumed to be equal.

Figure 5A:
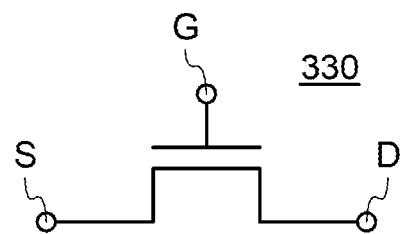
FIGS. 5A and 5B are views illustrating electrical characteristics of a transistor.
Figure 5B:
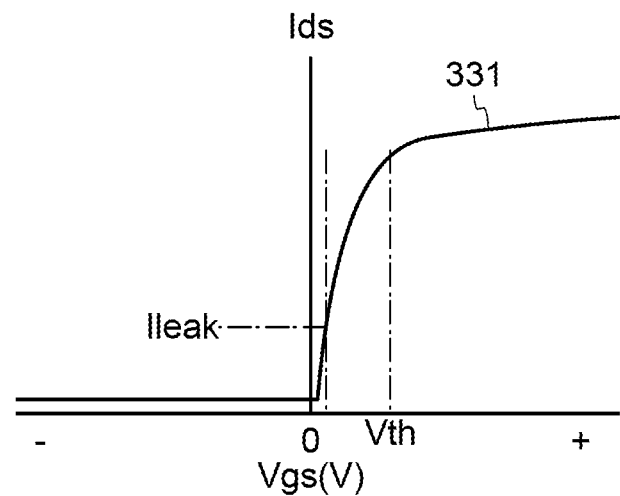

FIGS. 5A and 5B are diagrams for illustrating electrical characteristics of a field-effect transistor. In FIGS. 5A and 5B, an n-channel transistor 330 is shown as an example. FIG. 5A shows a circuit symbol of the transistor 330. In general, a field-effect transistor includes three terminals (a gate G, a source S, and a drain D), and a conduction state between the source S and the drain D can be controlled by a voltage applied to the gate G.

FIG. 5B shows change in current flowing between the source S and the drain D (hereinafter also referred to as "$I_{ds}$") in the case where a voltage between the gate G and the source S with respect to the source S of the transistor 330 (hereinafter also referred to as "$V_{gs}$") is changed. In FIG. 5B, the horizontal axis represents change in $V_{gs}$ and the vertical axis represents change in $I_{ds}$ in a log scale. A curve 331 represents a relation between $V_{gs}$ and $I_{ds}$ and is also called a "V-I curve", a "$V_g$-$I_d$ curve", and the like in general. Note that the curve 331 illustrates the $V_g$-$I_d$ curve of an enhancement-mode (normally off) transistor as an example.

In the n-channel transistor 330, $I_{ds}$ is sharply increased when $V_{gs}$ exceeds $V_{th}$. In addition, $I_{ds}$ is sharply decreased when $V_{gs}$ becomes lower than $V_{th}$ (note that the vertical axis in FIG. 5B is scaled logarithmically). When $V_{gs}$ becomes lower than or equal to 0 V, $I_{ds}$ hardly flows. Therefore, conduction (an on state of the transistor) or non-conduction (an off-state of the transistor) between the source S and the drain D can be controlled by using $V_{th}$ as a border.

Note that as illustrated in FIG. 5B, there is a region where $I_{ds}$ more than $I_{ds}$ in the case of $V_{gs}$ of 0 V or lower flows even when $V_{gs}$ is lower than $V_{th}$. In general, the region is called a "subthreshold region".

Note that the $V_g$-$I_d$ curve of a p-channel transistor is formed in such a manner that the curve 331 is horizontally inverted about a vertical axis passing through 0 V of a horizontal axis.

In the period 704, the potential of the control signal S2 is changed from the high-level potential S2H to the low-level potential S2L. At this time, while the potential of the control signal S2 is larger than $V_{th}$ (a period 704a), the transistors 115 and 117 are in an on state; accordingly, potentials are supplied to the nodes M and N. When the potential of the control signal S2 is lower than $V_{th}$, the transistors 115 and 117 are turned off; accordingly, the supply of the potentials to the nodes M and N is stopped. After that, the potential of the control signal S2 is further lowered to be the low-level potential S2L. Since the transistors 115 and 117 are in an off state, the potentials of the nodes M and N are changed in accordance with change in the potential of the control signal S2. As a result, the potentials become a potential represented by Equation 1 (the period 704b). Note that in practice, the transistors 115 and 117 temporarily operate in a subthreshold region while the potentials change from $V_{th}$ to the low-level potential S2L; therefore, a potential is supplied to the nodes M and N in the subthreshold region. However, the change from $V_{th}$ to the low-level potential S2L is performed within a very short time, a subthreshold region can be ignored.

$$Vmn - (Vth - S2L)\frac{Cp}{Cp + Cs} \quad \text{(Equation 1)}$$

In Equation 1, $V_{mn}$ represents the potential of the node M when the transistor 115 is in an on state or the potential of the node N when the transistor 117 is in an on state; $C_p$ represents parasitic capacitance between the gate of the transistor 115 and the node M or between the gate of the transistor 117 and the node N; and $C_s$ represents a capacitance value of the capacitor 116 or 118.

For example, assuming that $V_{DD}$ is 3 V, $V_{SS}$ is 0 V, $V_{th}$ is 1 V, the potential of the node N when the transistor 117 is in an on state is $V_{SS}$, the low-level potential S2L is $V_{SS}$, and a capacitance ratio between $C_p$ and $C_s$ is $C_p$:$C_s$=1:4, the potential of the node N when the potential of the control signal S2 becomes the low-level potential S2L (0 V) is 0−(1−0)×1/(1+4)=−0.2 V.

Here, the potential of the node O is $V_{SS}$ (0 V) and the potential of the node N is −0.2 V, and accordingly a source of the transistor 117 is a terminal connected to the node N. In addition, the potential of the gate of the transistor 117 is $V_{SS}$ (0 V). Thus, a voltage of 0.2 V is relatively applied to the gate of the transistor 117. Accordingly, it is possible that the source and the drain of the transistor 117 are slightly in a conduction state (see $I_{leak}$ in FIG. 5B). As a result, the potential of the node N is changed toward $V_{SS}$ (0 V) (the period 704c).

On the other hand, the potential of the node M when the transistor 115 is in an on state is $V_{DD}$ (3 V). The potential of the node M when the potential of the control signal S2 becomes the low-level potential S2L (0V) becomes 3−(1−0)×1/(1+4)=2.8 V.

The potential of the node P is $V_{DD}$ (3 V) and the potential of the node M is 2.8 V, and accordingly a source of the transistor 115 is a terminal connected to the node M. In addition, the potential of the gate of the transistor 115 is $V_{SS}$ (0 V). Thus, a voltage of −2.8 V is relatively applied to the gate of the transistor 115. Accordingly, the source and the drain of the transistor 115 are in a non-conduction state. As a result, the potential of the node M is kept at 2.8 V in the period 704c.

In this embodiment, a potential difference dV (hereinafter, also simply referred to as "dV") between the nodes M and N at the time of terminating the period 703 is 3 V. In the case where the fourth potential V4 is kept at the low-level potential V4L after the control signal S2 becomes the low-level potential S2L in the period 704, the potential difference dV between the nodes M and N might be small in the period 704c. In such a case, a margin in writing data from the memory circuits 102 and 103 to the logic circuit 101 is reduced, whereby the operation of the memory element 110 is unstable, which may be a cause of a reduction in reliability.

In particular, a reduction in dV becomes noticeable as $C_p$ becomes higher or $C_s$ becomes lower so that a capacitance ratio between $C_p$ and $C_s$ ($C_p/C_s$) becomes smaller by miniaturization or high integration of the semiconductor device. In addition, a reduction in dV becomes noticeable as an operation voltage becomes smaller for low power consumption.

Then, change in the potentials of the nodes M and N in the case where the fourth potential V4 is set to $V_{SS}$ after the control signal S2 becomes the low-level potential S2L in the period 704 will be described with reference to FIGS. 4B1 and 4B2.

Note that the periods 704a and 704b in FIGS. 4B1 and 4B2 are similar to those in FIGS. 4A1 and 4A2 and therefore the description thereof is omitted. After the period 704b, the fourth potential V4 is set to be $V_{SS}$ (0 V) in the period 704c. Assuming that the low-level potential V4L is −1 V, the fourth potential V4 is set to be $V_{SS}$ in the period 704c, so that the potential of the node N is −0.2+1=0.8 V and the potential of the node M is 2.8+1=3.8 V.

When the potential of the node N becomes 0.8 V, the source of the transistor 117 is a terminal connected to the node O and a voltage between the gate and source becomes 0 V. Therefore, the source and the drain of the transistor 115 are in a non-conduction state even in the period 704c, and the potential of the node N is kept at 0.8 V. The potential of the node M is kept at 3.8 V for the same reason.

The potential difference dV at this time is 3.8−0.8=3 V, and therefore dV at the time of terminating the period 703 can be maintained even in the period 704. As a result, the operation of the memory element 110 can be stable and the reliability of the semiconductor device can be increased.

In this embodiment, the case where the fourth potential V4 is set to be the low-level potential V4L in the period 703 and set to be $V_{SS}$ in the period 704 is described; however, an embodiment of the present invention is not limited thereto. The important point is that the fourth potential V4 in the period 704 is higher than the fourth potential V4 in the period 703. For example, the fourth potential V4 may be set to be $V_{SS}$ in the period 703 and the fourth potential V4 may be set to be the high-level potential V4H in the period 704.

A period 705 is a period where the supply of power is stopped. In the period 705, the first potential V1 is set to be $V_{SS}$, whereby the supply of power to the memory device 100 is stopped. Concurrently, the third potential V3 is set to be $V_{SS}$. In the period 705, the first to fourth potentials V1 to V4, the control signal S1, and the control signal S2 are all equipotential, so that the memory device 100 can stop consuming power (see FIG. 2).

The stop of supply of power turns off the transistors 123 and 124, so that the potentials of the nodes O and P in the logic circuit 101 cannot be held.

In addition, the transistors 115 and 117 are turned off. However, in one embodiment of the present invention, with the use of a transistor in which a channel is formed in an oxide semiconductor as each of the transistors 115 and 117, a potential (potential of the node M) held by the capacitor 116 and a potential (potential of the node N) held by the capacitor 118 can be held for a long time even after the transistors 115 and 117 are turned off. In other words, even after the supply of power is stopped, the data (potential) which has been written to the nodes O and P of the logic circuit 101 can be held in the nodes M and N.

A period 706 is a period where the supply of power is resumed. The first power source potential V1 is changed to $V_{DD}$, so that the supply of power to the memory device 100 is started. In addition, the high-level potential S1H is supplied as the control signal S1 to turn on the transistors 123 and 124, and a precharge potential $V_{PRE}$ is supplied as the second potential V2, the third potential V3, the data D, and the data DB. Then, the nodes O, P, Q, and R have a precharge potential $V_{PRE}$ (see FIG. 3).

Note that in the period 706, the second potential V2 and the third potential V3 are equipotential, and therefore power is not consumed in the logic circuit 101.

A period 707 is a period where data held in the memory circuits 102 and 103 is restored (written) to the logic circuit 101. In the period 707, the fourth potential V4 is set to the high-level potential V4H. Then, the potential of the node N is increased by a difference between V4H and $V_{SS}$, thereby becoming the potential $V_{SSB}$ in this embodiment. Further, the potential of the node M is increased by a difference between V4H and $V_{SS}$, thereby becoming the potential $V_{DDB}$ in this embodiment.

In addition, the low-level potential S1L is supplied as the control signal S1 to turn off the transistors 123 and 124. The potentials of the data D and the data DB are preferably a precharge potential $V_{PRE}$ until the low-level potential S1L is supplied.

The transistors 123 and 124 are turned off, and then, the high-level potential S2H is supplied as the control signal S2 to turn on the transistors 115 and 117. Accordingly, the potentials of the nodes M and N are supplied to the nodes P and O, respectively (see FIG. 3).

Note that in the case where the fourth potential V4 is set to be the low-level potential V4L in the period 707, the potentials written to the nodes N and M in the period 703 can be supplied to the nodes O and P without change. However, in this embodiment, the fourth potential V4 is set to be the high-level potential V4H. As described above, in the case where the fourth potential V4 is the high-level potential V4H, the potentials of the nodes M and N are increased by the high-level potential V4H. Accordingly, a potential difference between the nodes O and N and a potential difference between the nodes P and M before the transistors 115 and 117 are turned on become large; thus, data can be written to (restored to) the logic circuit 101 within a short time. That is, the operation speed of the memory element 110 immediately before the stop of the supply of power can be increased.

In this case, the potentials written to the nodes O and P are different from those in the period 703. A potential difference dV between the nodes O and P can be substantially the same as a potential difference dV between the nodes N and M. In other words, in the memory element 110 disclosed in this embodiment, the potential difference between the nodes O and P in the logic circuit 101 is held in the memory circuits 102 and 103.

In this embodiment, a potential written to the node P in the period 707 is higher than the potential of the node O by dV. Note that the fourth potential V4 may be set to be the high-level potential V4H in the period 706.

A period 708 is a period where the supply of the power to the logic circuit 101 is resumed. In the period 708, $V_{SS}$ is supplied to the node Q as the second potential V2 and $V_{DD}$ is supplied to the node R as the third potential V3. Then, the inverter circuits 104 and 105 operate, so that the potential of the node P becomes $V_{DD}$ and the potential of the node O becomes $V_{SS}$. Further, the potential of the node M becomes $V_{DD}$ and the potential of the node N becomes $V_{SS}$ (see FIG. 3).

Note that the potential difference dV held by using the memory circuits 102 and 103 is not necessarily the same as the potential difference dV between the nodes O and P in the logic circuit 101 immediately before the stop of the supply of power as long as which potential is higher or lower between those held in the nodes O and P is apparent. For example, in this embodiment, it is acceptable as long as it is found that the potential of the node P is higher than that of the node O.

As described above, the supply of power to the logic circuit 101 is resumed, so that the data D and the data DB can be held in the nodes O and P. After that, the low-level potential S2L is supplied to the gates of the transistors 115 and 117 as the control signal S2, whereby the transistors 115 and 117 are turned off.

A period 709 is a period where the data held in the nodes O and P of the logic circuit 101 is read. In the period 709, the high-level potential S1H is supplied to the third terminals of the switches 106 and 107 (the gates of the transistors 123 and 124) as the control signal S1, so that electrical continuity between the first terminal and the second terminal is established in each of the switches 106 and 107. The data D held in the node O of the logic circuit 101 can be read through the switch 106, and the data DB held in the node P of the logic circuit 101 can be read through the switch 107. After reading is completed, the low-level potential S1L is supplied to the third terminals of the switches 106 and 107 as the control signal S1, whereby electrical discontinuity between the first terminal and the second terminal is established in each of the switches 106 and 107 (see FIG. 3).

Note that in this embodiment, in the period 709, the control signal S2 is the low-level potential S2L; however, the control signal S2 may be the high-level potential S2H.

In the above manner, the memory element 110 or a semiconductor device using the memory element 110 can operate.

In a semiconductor device of one embodiment of the present invention, a memory circuit including a transistor with low off-state current is provided in a memory element. One example of the transistor with low off-state current is a transistor in which a channel is formed in an oxide semiconductor. Such a transistor has a characteristic of extremely low off-state current. Thus, when the transistor is in an off state, a potential can be held in a capacitor connected to the transistor for a long time. Therefore, even after supply of power is stopped, a logic state of the logic circuit included in the memory element can be held. With such a memory element, a semiconductor device which can keep a stored logic state even when the supply of power is stopped can be provided.

In the semiconductor device according to one embodiment of the present invention, the data D and data DB held in the logic circuit 101 are respectively held in the memory circuit 102 and the memory circuit 103 which are connected to the logic circuit 101 before the supply of power is stopped. Accordingly, since it is not necessary to transfer the data held in the semiconductor device to another semiconductor device before the supply of power is stopped, the supply of power can be stopped within a short time.

In addition, in a semiconductor device according to one embodiment of the present invention, the fourth potential V4 in the periods 704 to 706 is higher than that in the period 703. Accordingly, the potential difference dV between data held in the memory circuits 102 and 103 can be prevented from being decreased, so that data can be stably restored to the logic circuit 101. Therefore, the operation of the memory element 110 can be stable and the reliability of the semiconductor device can be increased.

In addition, in the memory element 110 according to one embodiment of the present invention, the fourth potential V4 is increased when data is restored from the memory circuits 102 and 103 to the logic circuit 101. Accordingly, data can be restored from the memory circuits 102 and 103 to the logic circuit 101 within a short time. That is, the operation speed of the memory element 110 can be increased, and the operation speed of a semiconductor device using the memory element 110 can be increased. In a semiconductor device using the memory element 110 according to one embodiment of the present invention, the supply of power can be stopped as needed, whereby power consumption can be reduced. Further, in the memory element 110 according to one embodiment of the present invention, the operation for stopping the supply of power and the operation for resuming the supply of power can be performed at high speed; therefore, the supply of power can be stopped easily even for a short time. Accordingly, the supply of power can be frequently stopped and power consumption of the semiconductor device can be further reduced.

The methods and structures described in one of this embodiment can be combined as appropriate with any of the methods and structures described in the other embodiments.

Embodiment 2

Figure 6:
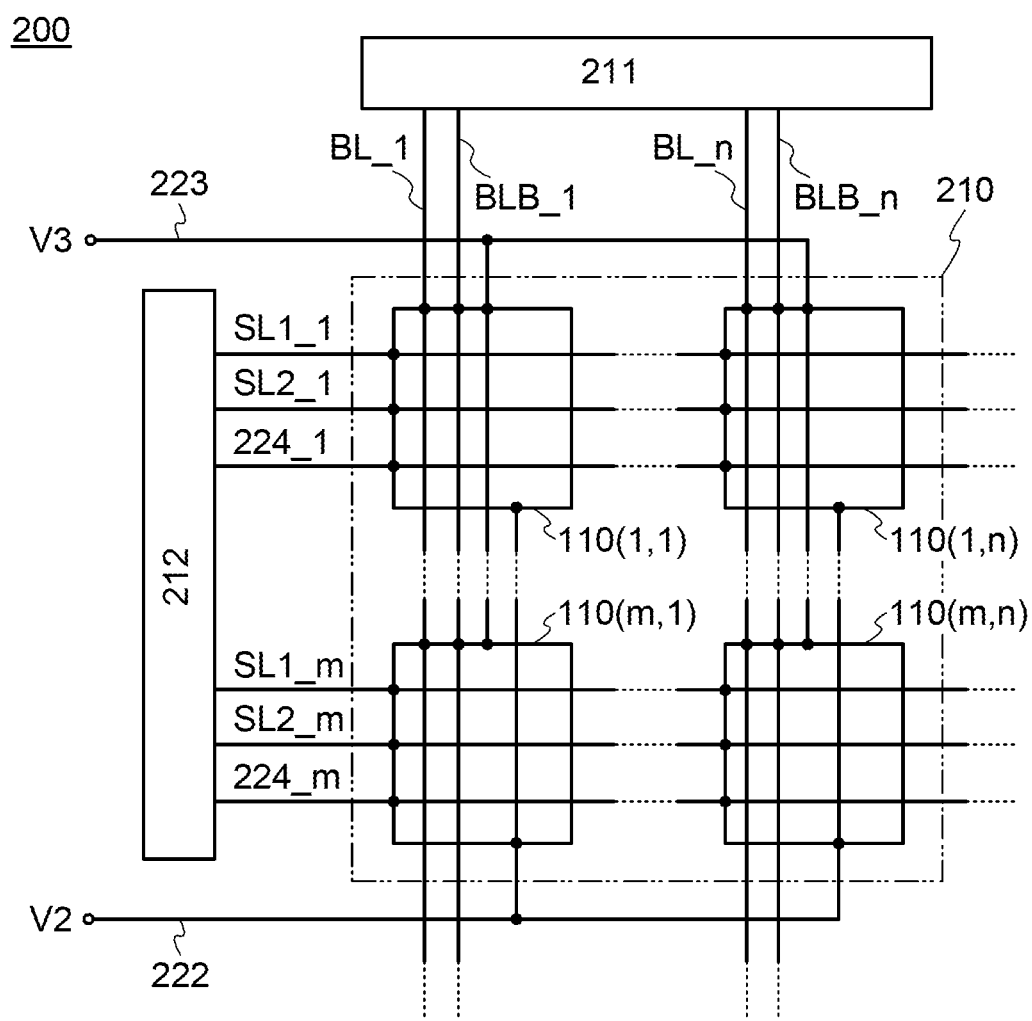
FIG. 6 is a circuit diagram of a memory cell array.

In this embodiment, an example where a memory cell array is formed to include the plurality of memory elements 110 illustrated in FIGS. 1A and 1B will be described with reference to FIG. 6 and FIG. 7. FIG. 6 is an example of a block diagram of a semiconductor device including (m×n) memory elements 110.

A memory device 200 illustrated in FIG. 6 includes m signal lines SL1 (m is an integer of 2 or more), m signal lines SL2, n bit lines BL (n is an integer of 2 or more), n inverted bit lines BLB, a first wiring 221 (not illustrated), a second wiring 222, a third wiring 223, m fourth wirings 224, a memory cell array 210 having the memory elements 110 arranged in matrix of m rows (in the vertical direction)×n columns (in the horizontal direction), a first driver circuit 211, and a second driver circuit 212. The first driver circuit 211 is connected to the n bit lines BL and the n inverted bit lines BLB. The second driver circuit 212 is connected to the m signal lines SL1, the m signal lines SL2, and the m fourth wirings 224. The first wiring 221 supplies power to the memory device 200 (not illustrated), and the second wiring 222 and the third wiring 223 are connected to the memory elements 110(1, 1) to 110(m, n).

The control signal S1 is supplied to the signal line SL1. The control signal S2 is supplied to the signal line SL2. The data D is supplied to the bit line BL. The data DB is supplied to the inverted bit line BLB. The first potential V1 is supplied to the first wiring 221. The second potential V2 is supplied to the second wiring 222. The third potential V3 is supplied to the third wiring 223. The fourth potential V4 is supplied to the fourth wiring 224.

Access to the memory elements 110(1, 1) to 110(m, n) is performed through the signal lines SL1 and the signal lines SL2. Data is written and read to/from the memory cells connected to the respective bit lines BL and inverted bit lines BLB.

The first driver circuit 211 controls access through the bit lines BL and the inverted bit lines BLB to the memory cells in the horizontal direction. On the other hand, the second driver circuit 212 controls access through the signal lines SL1 and the signal lines SL2 to the memory cells in the vertical direction.

The memory device 200 illustrated in FIG. 6 can employ the method for driving the memory element 110 described in Embodiment 1. Access to the memory elements 110 in the memory cell array 210 on a row-by-row basis is possible. Random access to the memory elements 110 in the memory cell array 210 is possible.

Figure 7:
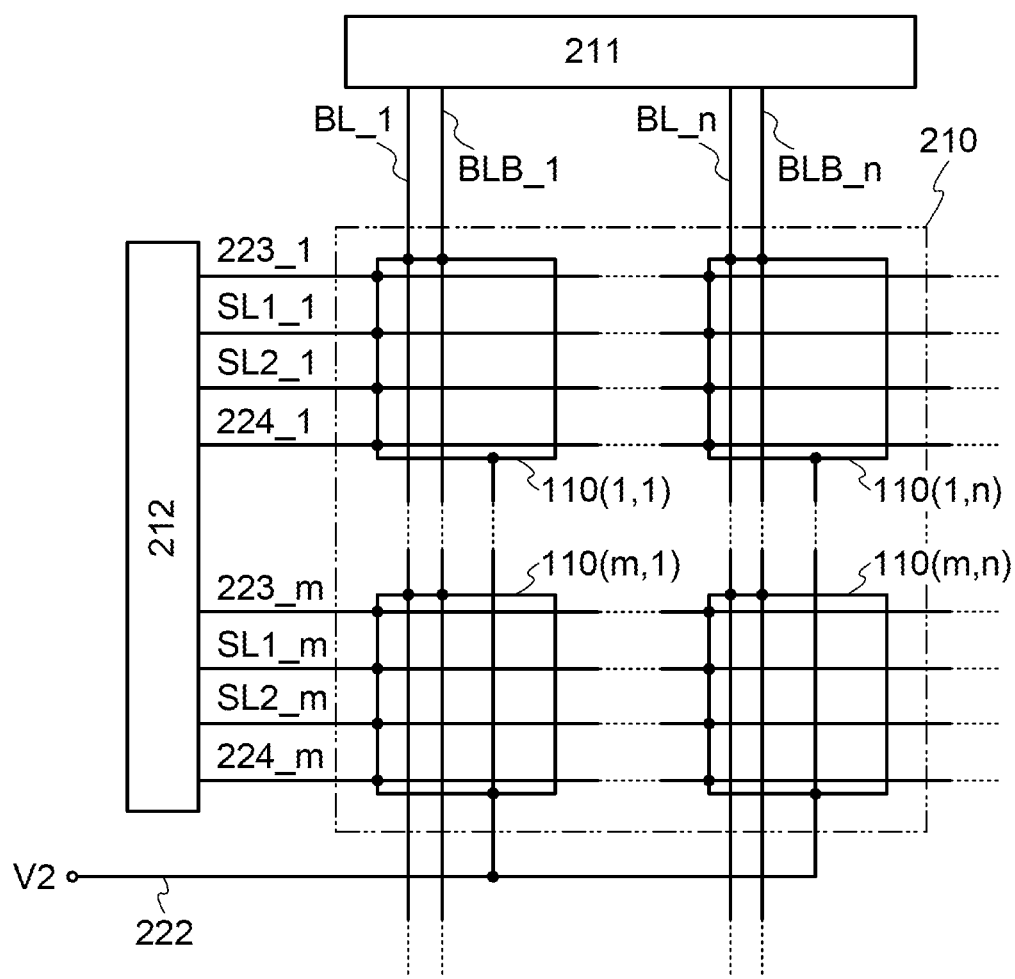
FIG. 7 is a circuit diagram of a memory cell array.

In a memory device 201 illustrated in FIG. 7, the number of the third wirings 223 in the memory device 200 illustrated in FIG. 6 is m and the third wirings 223 are connected to the memory elements 110 on a row-by-row basis. Note that FIG. 7 shows an example where the third wiring 223 is connected to the second driver circuit 212; however, the third wiring 223 may be connected to the first driver circuit 211. Further, a driver circuit connected to the third wiring 223 may be provided in addition to the first driver circuit 211 and the second driver circuit 212.

The third wiring 223 is provided on a row-by-row basis, whereby power can be supplied to the memory element 110 on a row-by-row basis; consequently, an effect of reducing power consumption can be increased. Alternatively, the third wiring 223 may be provided on a column-by-column basis. Alternatively, the second wiring 222 may be provided on a row-by-row basis or a column-by-column basis. Alternatively, the n second wirings 222 and the m third wirings 223 are arranged to form a grid pattern to enable random control the supply of power to the memory element 110.

The methods and structures described in one of this embodiment can be combined as appropriate with any of the methods and structures described in the other embodiments.

Embodiment 3

In this embodiment, an example of a method for manufacturing the memory element described in Embodiment 1 will be described with reference to FIGS. 8A to 8E, FIGS. 9A to 9D, FIGS. 10A to 10D, and FIGS. 11A and 11B. First, a method for manufacturing a transistor in a lower portion of the memory device will be described, and then, a method for manufacturing a transistor and a capacitor in an upper portion of the memory device will be described. Note that in cross-sectional views illustrating a manufacturing process, A1-A2 is a cross section illustrating a manufacturing step of an n-channel transistor and B1-B2 is a cross section illustrating a manufacturing step of a p-channel transistor.

<Method for Manufacturing Transistor in Lower Portion>

Figure 8A:
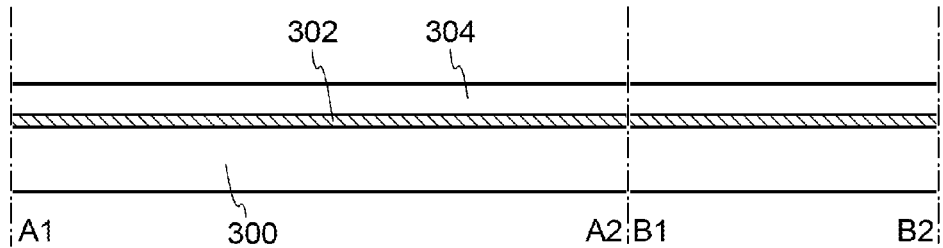
FIGS. 8A to 8E illustrate a method for manufacturing a memory device.

First, a substrate 300 over which a semiconductor layer 304 is provided with an insulating layer 302 laid therebetween is prepared (see FIG. 8A).

Examples of the substrate 300 include a single crystal semiconductor substrate of silicon, silicon carbide, or the like, a polycrystalline semiconductor substrate of silicon, silicon carbide, or the like, and a compound semiconductor substrate of silicon germanium, gallium arsenide, indium phosphide, or the like. Further, a variety of glass substrates, such as substrates of aluminosilicate glass, aluminoborosilicate glass, and barium borosilicate glass, a quartz substrate, a ceramic substrate, and a sapphire substrate can also be used.

The insulating layer 302 is formed to have a single-layer structure or a stacked-layer structure using silicon oxide, silicon oxynitride, silicon nitride, or the like. Examples of a formation method of the insulating layer 302 include a thermal oxidation method, a CVD method, and a sputtering method. The thickness of the insulating layer 302 is greater than or equal to 1 nm and less than or equal to 100 nm, preferably greater than or equal to 10 nm and less than or equal to 50 nm.

The semiconductor layer 304 can contain a single crystal semiconductor material or a polycrystalline semiconductor material of silicon, silicon carbide, or the like, or a compound semiconductor material of silicon germanium, gallium arsenide, indium phosphide, or the like. Since the semiconductor layer 304 does not contain an oxide semiconductor material, the semiconductor layer 304 is also referred to as a layer containing a semiconductor material other than an oxide semiconductor.

The semiconductor layer 304 preferably contains a single crystal semiconductor material of silicon or the like because the logic circuit 101, the switch 106, the switch 107, and the like which are described in Embodiment 1 can operate at higher speed.

Alternatively, an SOI substrate can be used as the substrate 300 over which the semiconductor layer 304 is provided with the insulating layer 302 laid therebetween. Note that the term "SOI substrate" generally means a substrate in which a silicon layer is provided over an insulating surface. In this specification and the like, the term "SOI substrate" also means a substrate in which a semiconductor layer containing a material other than silicon is provided over an insulating surface. That is, a semiconductor layer included in the "SOI substrate" is not limited to a silicon layer. Further, the "SOI substrate" includes a substrate in which a semiconductor layer is provided over an insulating substrate such as a glass substrate with an insulating layer laid therebetween. In this embodiment, the case is described in which an SOI substrate in which a silicon layer is provided over a single crystal silicon substrate with a silicon oxide layer laid therebetween is used as the substrate 300 over which the semiconductor layer 304 is provided with the insulating layer 302 laid therebetween.

Figure 8B:
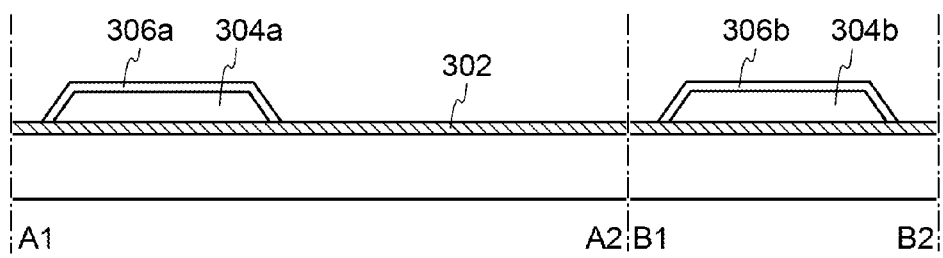

Next, the semiconductor layer 304 is processed into an island shape to form semiconductor layers 304a and 304b (see FIG. 8B). For the processing, dry etching is preferably performed, but wet etching may be performed. An etching gas and an etchant can be selected as appropriate depending on a material of a layer to be etched.

Next, gate insulating layers 306a and 306b are formed so as to cover the semiconductor layers 304a and 304b (see FIG. 8B). The gate insulating layers 306a and 306b can be formed, for example, by performing heat treatment (e.g., thermal oxidation treatment, thermal nitridation treatment, or the like) on surfaces of the semiconductor layers 304a and 304b. High-density plasma treatment may be employed instead of heat treatment. The high-density plasma treatment can be performed using, for example, oxygen, nitrogen, a gas containing oxygen and/or nitrogen such as nitrogen oxide and ammonia, and a mixed gas thereof. Alternatively, a gas obtained by mixing hydrogen or a rare gas with a gas containing oxygen or nitrogen can be used.

The gate insulating layers 306a and 306b may be formed using a CVD method, a sputtering method, or the like. The gate insulating layers 306a and 306b can be formed using silicon oxide, silicon oxynitride, silicon nitride, hafnium oxide, aluminum oxide, tantalum oxide, or the like. Alternatively, the gate insulating film may be formed using a material with a high dielectric constant (a high-k material) such as hafnium oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), or hafnium aluminate to which nitrogen is added (HfAl$_x$O$_y$N$_z$ (x>0, y>0, z>0)). The gate insulating layers can be formed to have a single-layer structure or a stacked-layer structure using the above-described material and method. Further, the thickness of each of the gate insulating layers 306a and 306b can be, for example, greater than or equal to 1 nm and less than or equal to 100 nm, preferably greater than or equal to 10 nm and less than or equal to 50 nm.

Note that when the gate insulating layer is thin, gate leakage due to a tunneling effect or the like becomes a problem. In order to solve the problem of gate leakage, the above high-k material is preferably used for the gate insulating layer. By using a high-k material for the gate insulating layer, the thickness thereof can be increased for suppression of gate leakage with favorable electric characteristics of the gate insulating layer maintained. Note that a stacked-layer structure of a layer containing a high-k material and a layer containing any of silicon oxide, silicon nitride, silicon oxynitride, silicon nitride oxide, aluminum oxide, or the like may be employed.

In this embodiment, silicon oxide is formed by thermal oxidation treatment over the semiconductor layers 304a and 304b to form the gate insulating layers 306a and 306b.

Figure 8C:
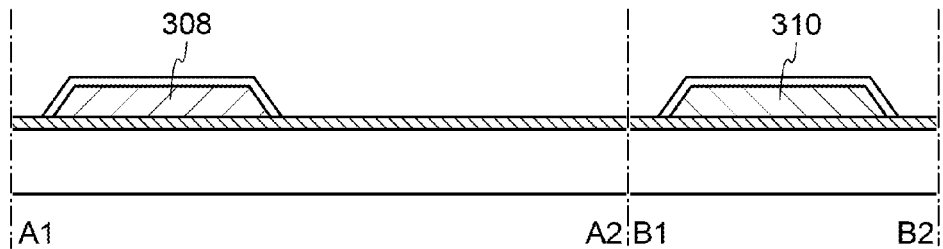

Next, an impurity element imparting n-type conductivity and an impurity element imparting p-type conductivity are added to the semiconductor layers 304a and 304b through the gate insulating layers 306a and 306b in order to control the threshold voltages of the transistors (see FIG. 8C). In the case where silicon is used for the semiconductor layers 304a and 304b, for example, phosphorus, arsenic, or the like can be used as an impurity element imparting n-type conductivity. On the other hand, boron, aluminum, gallium, or the like can be used as an impurity element imparting p-type conductivity. In this embodiment, in order to control the threshold voltage, boron is added to the semiconductor layer 304a through the gate insulating layer 306a to form a semiconductor layer 308 and phosphorus is added to the semiconductor layer 304b through the gate insulating layer 306b to form a semiconductor layer 310.

Figure 8D:
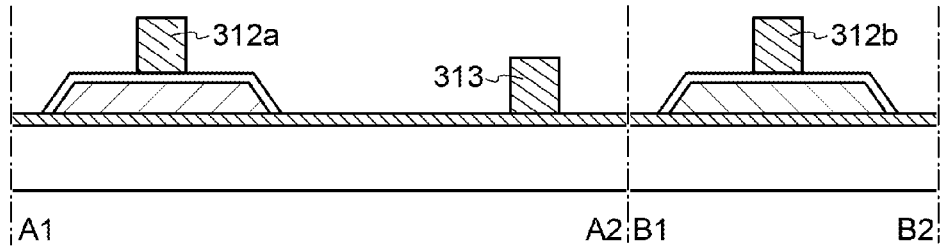
Figure 8E:
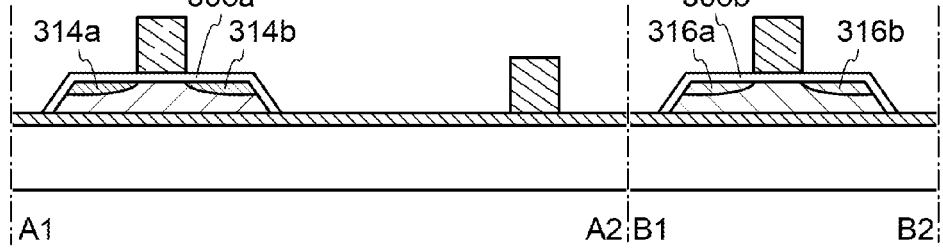

Next, a conductive layer 312 (not illustrated) used for forming a gate electrode (including another electrode or a wiring formed using the same layer as the gate electrode) is formed over the gate insulating layers 306a and 306b and is processed, so that gate electrodes 312a and 312b and an electrode 313 are formed (see FIG. 8D).

The conductive layer used for the gate electrodes 312a and 312b and the electrode 313 can be formed using a metal material such as aluminum, copper, titanium, tantalum, or tungsten. The conductive layer may be formed using a semiconductor material such as polycrystalline silicon. There is no particular limitation on the method for forming the conductive layer, and a variety of film formation methods such as an evaporation method, a CVD method, a sputtering, method or a spin coating method can be employed. The conductive layer may be processed by etching using a resist mask. In this embodiment, a tantalum nitride film and a tungsten film are stacked by a sputtering method and processed, so that the gate electrodes 312a and 312b and the electrode 313 are formed.

Next, an impurity element imparting n-type conductivity is added to the semiconductor layer 308 through the gate insulating layer 306a by using the gate electrode 312a as a mask. In addition, an impurity element imparting p-type conductivity is added to the semiconductor layer 310 through the gate insulating layer 306b by using the gate electrode 312b as mask (see FIG. 8E). In this embodiment, phosphorus is added to the semiconductor layer 308 through the gate insulating layer 306a, so that impurity regions 314a and 314b are formed, and boron is added to the semiconductor layer 310 through the gate insulating layer 306b, so that impurity regions 316a and 316b are formed.

Figure 9A:
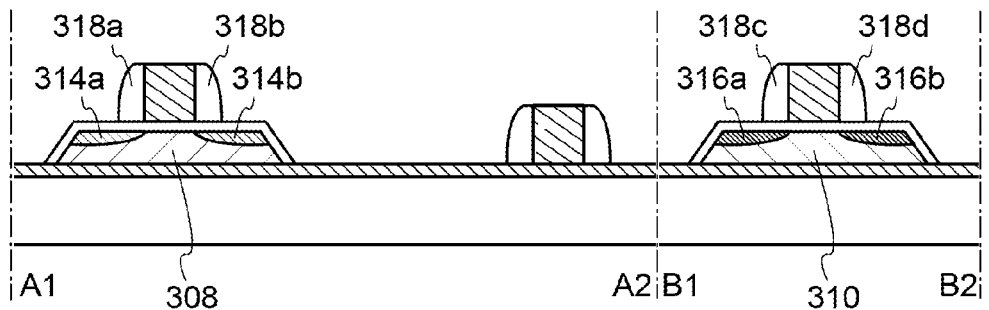
FIGS. 9A to 9D illustrate a method for manufacturing a memory device.

Then, sidewalls 318a to 318d are formed on the side surfaces of the gate electrodes 312a and 312b (see FIG. 9A). The sidewalls 318a to 318d may be formed on the side surfaces of the gate electrodes 312a and 312b in a self-aligning manner, by forming an insulating layer that covers the gate electrodes 312a and 312b, and then processing the insulating layer by anisotropic etching by a reactive ion etching (RIE) method.

There is no particular limitation on the insulating layer used for the sidewalls 318a to 318d; for example, a silicon oxide film with favorable step coverage, which is formed by reacting TEOS (tetraethyl ortho-silicate), silane, or the like with oxygen, nitrous oxide, or the like can be used. A silicon oxide layer formed by a low temperature oxidation (LTO) method may also be used. The insulating layer can be formed by a thermal CVD method, a plasma CVD method, an atmospheric pressure CVD method, a bias ECRCVD method, a sputtering method, or the like.

Note that sidewalls are formed on the side surfaces of the electrode 313 at the same time as the sidewalls 318a to 318d.

Figure 9B:
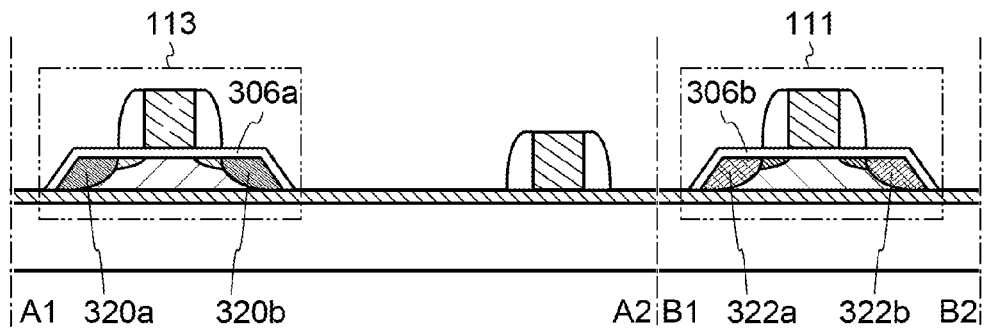

Next, an impurity element imparting n-type conductivity and an impurity element imparting p-type conductivity are added to the semiconductor layers 308 and 310 through the gate insulating layers 306a and 306b by using the gate electrodes 312a and 312b and the sidewalls 318a to 318d as a mask (see FIG. 9B). In this embodiment, phosphorus is added to the semiconductor layer 308 through the gate insulating layer 306a, so that impurity regions 320a and 320b are formed, and boron is added to the semiconductor layer 310 through the gate insulating layer 306b, so that impurity regions 322a and 322b are formed. The impurity element is preferably added so that the impurity regions 320a and 320b have higher concentration than the impurity regions 314a and 314b, and the impurity element is preferably added so that the impurity regions 322a and 322b have higher concentration than the impurity regions 316a and 316b.

Through the above, the n-channel transistor 113 and the p-channel transistor 111 can be manufactured using the substrate 300 containing a semiconductor material other than an oxide semiconductor (see FIG. 9B). Such transistors are capable of high-speed operation. Thus, the transistors are preferably applied to the logic circuit 101, the switch 106, the switch 107, the precharge circuit 108, and the like because in that case, the speed of operation thereof can be increased.

Figure 9C:
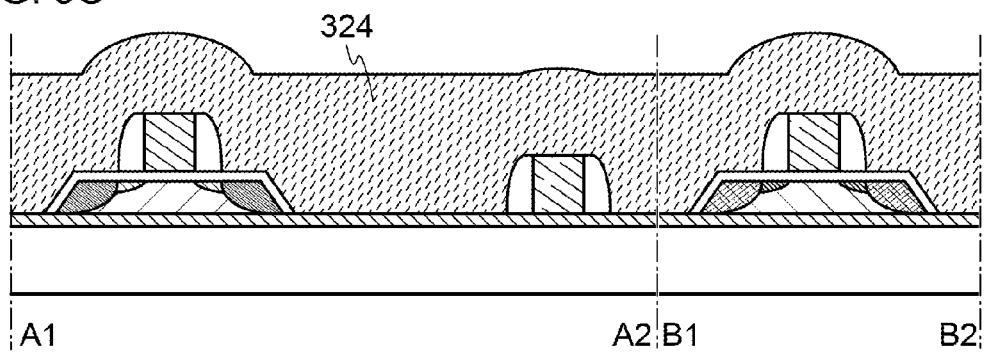
Figure 9D:
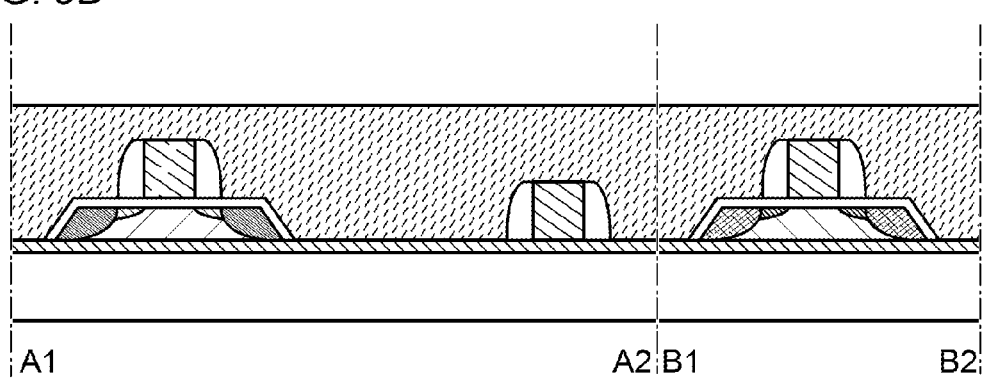

Next, an insulating layer 324 is formed so as to cover the transistor 113 and the transistor 111 (see FIG. 9C). The insulating layer 324 can be formed using a material containing an inorganic insulating material such as silicon oxide, silicon oxynitride, silicon nitride, or aluminum oxide. A material with a low dielectric constant (a low-k material) is preferably used for the insulating layer 324 because capacitance due to overlap of electrodes or wirings can be sufficiently reduced. A porous insulating material containing any of the above materials may be used for the insulating layer 324. Since the porous insulating material has lower dielectric constant than a dense insulating material, capacitance due to electrodes or wirings can be further reduced. Alternatively, an organic insulating material such as polyimide and acrylic can be used for the insulating layer 324.

In this embodiment, the case where the insulating layer 324 is formed using silicon oxynitride is described.

Next, after the insulating layer 324 is formed, heat treatment is performed to activate the impurity elements added to the semiconductor layers 308 and 310. The heat treatment is performed using an annealing furnace. Alternatively, a laser annealing method or a rapid thermal annealing (RTA) method can be used. The heat treatment is performed at 400° C. to 600° C., typically 450° C. to 500° C. in a nitrogen atmosphere for 1 to 4 hours. By this heat treatment, activation of the impurity elements is performed and hydrogen in silicon oxynitride of the insulating layer 324 is diffused into the semiconductor layers 308 and 310. With the hydrogen diffused into the semiconductor layers 308 and 310, defects at an interface between the gate insulating layer 306a and the semiconductor layer 308 and an interface between the gate insulating layer 306b and the semiconductor layer 310 can be reduced. In addition, defects in the semiconductor layers 308 and 310 can be reduced.

Note that before or after each of the above steps, a step of forming an electrode, a wiring, a semiconductor layer, an insulating layer, or the like may be further performed. For example, an electrode, a wiring, or the like for connecting the transistor in the lower portion and the transistor in the upper portion may be formed. In addition, a multilayer wiring structure in which an insulating layer and a conductive layer are stacked may be employed as a wiring structure, so that a highly-integrated semiconductor device can be achieved.

<Method for Manufacturing Transistor in Upper Portion>

Next, an example of a method for manufacturing the transistor 115 and the capacitor 116 over the insulating layer 324 will be described. First, to reduce the unevenness of the surface of the insulating layer 324, planarization treatment is performed on the surface of the insulating layer 324 (see FIG. 9D). As the planarization treatment, etching treatment or the like can be employed instead of polishing treatment such as chemical mechanical polishing (hereinafter, also referred to as CMP treatment). CMP treatment and etching treatment may be performed in combination. The surface of the insulating layer 324 is preferably planarized as much as possible in order to improve characteristics of the transistor 115.

The CMP treatment is a treatment of planarizing a surface of an object to be processed by a combination of chemical and mechanical actions. Specifically, the CMP treatment is a method in which a polishing cloth is attached to a polishing stage, the polishing stage and an object to be processed are each rotated or swung while a slurry (an abrasive) is supplied between the object to be processed and the polishing cloth, and the surface of the object to be processed is polished by a chemical reaction between the slurry and the surface of the object to be processed and by a mechanical polishing action of the polishing cloth on the object to be processed.

Figure 10A:
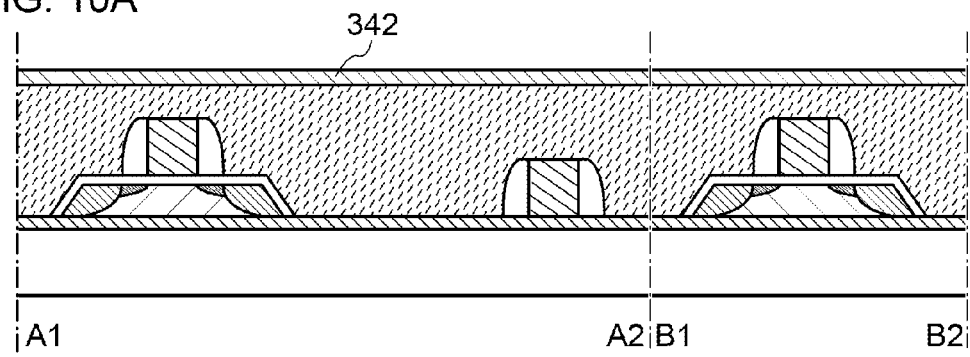
FIGS. 10A to 10D illustrate a method for manufacturing a memory device.

Next, an oxide semiconductor layer 342 is formed over the planarized surface of the insulating layer 324 (see FIG. 10A).

As a material for the oxide semiconductor layer 342, at least indium (In) or zinc (Zn) is preferably contained. In particular, both In and Zn are preferably contained. As a stabilizer for reducing variation in electric characteristics of a transistor including the oxide semiconductor, it is preferable that one or more elements selected from gallium (Ga), tin (Sn), hafnium (Hf), and aluminum (Al) be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than the In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having the appropriate composition may be used depending on necessary semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, with an In—Sn—Zn-based oxide, high mobility can be achieved relatively easily. However, even with an In—Ga—Zn-based oxide, mobility can be increased by reducing the defect density in the bulk.

Note that for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \leq r^2$, where r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have a structure including both an amorphous portion and a crystalline portion.

In an oxide semiconductor in an amorphous state, a flat surface can be obtained relatively easily, so that when a semiconductor element is manufactured with the use of the oxide semiconductor, interface scattering can be reduced, and relatively high mobility can be obtained relatively easily.

In an oxide semiconductor having crystallinity, defects in the bulk can be further reduced, and mobility higher than that of an amorphous oxide semiconductor can be obtained when a surface flatness is improved. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm. Note that the average surface roughness Ra is obtained by expanding arithmetic mean surface roughness that is defined by JIS B 0601: 2001 (ISO4287:1997), into three dimensions for application to a curved surface, and Ra can be expressed as the average value of the absolute values of deviations from a reference surface to a specific surface and is defined by Formula 2.

$$Ra = \frac{1}{S_0} \int_{y_1}^{y_2} \int_{x_1}^{x_2} |f(x, y) - Z_0| dx dy \qquad \text{(Equation 2)}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). The average surface roughness $(R_a)$ can be measured using an atomic force microscope (AFM).

In the case where an In—Zn-based oxide material is used for the oxide semiconductor layer 342, a target therefor has an In:Zn atomic ratio of 50:1 to 1:2 (an $In_2O_3$:ZnO molar ratio of 25:1 to 1:4), preferably, an In:Zn atomic ratio of 20:1 to 1:1 (an $In_2O_3$:ZnO molar ratio of 10:1 to 1:2), further preferably, an In:Zn atomic ratio of 15:1 to 1.5:1 (an $In_2O_3$:ZnO molar ratio of 15:2 to 3:4). For example, in a target used for formation of an In—Zn—O-based oxide which has an atomic ratio of In:Zn:O=X:Y:Z, the relation of Z>1.5X+Y is satisfied.

In the case of forming the oxide semiconductor layer 342 using In—Ga—Zn-based oxide by a sputtering method, it is preferable to use an In—Ga—Zn-based oxide target having an atomic ratio of In:Ga:Zn=1:1:1, 4:2:3, 3:1:2, 1:1:2, 2:1:3, or 3:1:4.

In the case of forming the oxide semiconductor layer 342 using an In—Sn—Zn-based oxide by a sputtering method, it is preferable to use an In—Sn—Zn-based oxide target having an atomic ratio of In:Sn:Zn=1:1:1, 2:1:3, 1:2:2, or 20:45:35.

The relative density of the target is greater than or equal to 90% and less than or equal to 100%, preferably greater than or equal to 95% and less than or equal to 99.9%. With the use of the target with high relative density, the oxide semiconductor layer 342 can have high density.

The oxide semiconductor layer 342 can be formed by a sputtering method, a molecular beam epitaxy method, an atomic layer deposition method, or a pulsed laser deposition method. The thickness of the oxide semiconductor layer 342 is greater than or equal to 5 nm and less than or equal to 100 nm, preferably greater than or equal to 10 nm and less than or equal to 30 nm.

The oxide semiconductor layer 342 may be amorphous or may have crystallinity. The oxide semiconductor layer 342 may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

The oxide semiconductor layer 342 may include a CAAC-OS. In the CAAC-OS, for example, c-axes are aligned, and a-axes and/or b-axes are not macroscopically aligned.

For example, the oxide semiconductor layer 342 may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, the oxide semiconductor layer 342 may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the oxide semiconductor layer 342 may be in a single-crystal state, for example.

The oxide semiconductor layer 342 preferably includes a plurality of crystal parts. In each of the crystal parts, a c-axis is preferably aligned in a direction parallel to a normal vector of a surface where the oxide semiconductor layer is formed or a normal vector of a surface of the oxide semiconductor layer. Note that, among crystal parts, the directions of the a-axis and the b-axis of one crystal part may be different from those of another crystal part. Note that, among crystal parts, the directions of the a-axis and the b-axis of one crystal part may be different from those of another crystal part.

Note that in most cases, a crystal part in the CAAC-OS film fits inside a cube whose one side is less than 100 nm. In an image obtained with a transmission electron microscope (TEM), a boundary between crystal parts in the CAAC-OS film are not clearly detected. Further, with the TEM, a grain boundary in the CAAC-OS film is not clearly found. Thus, in the CAAC-OS film, a reduction in electron mobility, due to the grain boundary, is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where an oxide semiconductor layer is formed on one surface and crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

With the use of the CAAC-OS film in a transistor, change in electric characteristics of the transistor due to irradiation with visible light or ultraviolet light is small. Thus, the transistor has high reliability.

Next, a formation method of the oxide semiconductor layer 342 as a CAAC-OS film is described. As a formation method of the oxide semiconductor layer 342 as a CAAC-OS film, the following two kinds of methods can be given, for example. One of the methods is that formation of the oxide semiconductor layer 342 is performed while a substrate is heated; the other method is that formation of the oxide semiconductor layer 342 is performed in two steps, and heat treatment is performed after each formation step of the oxide semiconductor layer 342.

In the case where the oxide semiconductor layer 342 is formed in one step while a substrate is heated, the substrate temperature may be higher than or equal to 100° C. and lower than or equal to 600° C., preferably higher than or equal to 200° C. and lower than or equal to 500° C. When the substrate is heated at high temperature during formation of the oxide semiconductor layer 342, CAAC-OS in which the proportion of a crystalline portion is higher than that of an amorphous portion can be formed.

In the case where formation of the oxide semiconductor layer 342 is performed in two steps, a first oxide semiconductor layer 342 is formed over the insulating layer 324 while the substrate temperature is kept at a temperature higher than or equal to 100° C. and lower than or equal to 450° C., and then heat treatment is performed at a temperature higher than or equal to 550° C. and lower than the strain point of the substrate under an atmosphere of nitrogen, oxygen, a rare gas, or dry air. By the heat treatment, a crystalline region (including a plate-like crystal) is formed in a region including a surface of the first oxide semiconductor layer 342. Next, a second oxide semiconductor layer 342 is formed thicker than the first oxide semiconductor layer 342. After that, heat treatment is performed again at a temperature higher than or equal to 550° C. and lower than the strain point of the substrate, so that crystals grow upward using, as a seed of crystal growth, the first oxide semiconductor layer 342 in which a crystalline region (including a plate-like crystal) is formed in the region including the surface. Thus, the second oxide semiconductor layer 342 is entirely crystallized. Note that the thickness of the first oxide semiconductor layer 342 is preferably greater than or equal to 1 nm and less than or equal to 10 nm.

The above formation method is preferable because a short-channel effect can be suppressed even when the thickness of the oxide semiconductor layer 342 is approximately 5 nm.

Since the crystallinity of the crystalline portion included in the CAAC-OS film is affected by roughness of a surface where CAAC-OS is formed, as described above, the surface of the insulating layer 324 is preferably planarized as much as possible. The average surface roughness of the insulating layer 324 is preferably greater than or equal to 0.1 nm and less than 0.5 nm. By planarizing the surface of the insulating layer 324, the continuity of the crystalline portion included in CAAC-OS can be improved. In addition, by planarizing the surface of the insulating layer 324, CAAC-OS in which the proportion of a crystalline portion is higher than that of an amorphous portion can be formed.

The oxide semiconductor layer 342 formed by a sputtering method contains hydrogen, water, a compound having a hydroxyl group, or the like in some cases. Hydrogen, water, and the like easily form a donor level and thus serve as impurities in the oxide semiconductor. Therefore, in the formation of the oxide semiconductor layer 342 by a sputtering method, the hydrogen concentration in the oxide semiconductor layer 342 is preferably reduced as much as possible.

In order to reduce the hydrogen concentration, the leakage rate of a treatment chamber of a sputtering apparatus is set to $1\times10^{-10}$ Pa·m$^3$/s or less in the formation of the oxide semiconductor layer 342, whereby entry of impurities such as an alkali metal and hydride into the oxide semiconductor layer 342 that is being deposited by a sputtering method can be reduced. Further, with the use of an entrapment vacuum pump (e.g., a cryopump) as an evacuation system, counter flow of impurities such as an alkali metal, a hydrogen atom, a hydrogen molecule, water, a compound having a hydroxyl group, and hydride from the evacuation system can be reduced.

When the purity of the target is set to 99.99% or higher, entry of alkali metal, hydrogen atoms, hydrogen molecules, water, a hydroxyl group, hydride, and the like into the oxide semiconductor layer can be suppressed. In addition, when the target is used, the concentration of alkali metal such as lithium, sodium, or potassium in the oxide semiconductor layer can be reduced.

Note that it has been pointed out that an oxide semiconductor is insensitive to impurities, there is no problem when a considerable amount of metal impurities is contained in the film, and therefore, soda-lime glass which contains a large amount of alkali metal such as sodium (Na) and is inexpensive can also be used (Kamiya, Nomura, and Hosono, "Carrier Transport Properties and Electronic Structures of Amorphous Oxide Semiconductors: The present status", *KOTAI BUTSURI* (*SOLID STATE PHYSICS*), 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not included in an oxide semiconductor. When an insulating layer in contact with the oxide semiconductor layer is an oxide, an alkali metal, in particular, Na diffuses into the insulating layer and Na becomes Na$^+$. Further, in the oxide semiconductor layer, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor layer is very low. Therefore, the concentration of the above impurity is preferably reduced when the hydrogen concentration of the oxide semiconductor layer is $1\times10^{18}$/cm$^3$ or lower, preferably $1\times10^{17}$/cm$^3$ or lower. Specifically, a measurement value of a Na concentration by secondary ion mass spectrometry is preferably less than or equal to $5\times10^{16}$/cm$^3$, more preferably less than or equal to $1\times10^{16}$/cm$^3$, still more preferably less than or equal to $1\times10^{15}$/cm$^3$. In a similar manner, a measurement value of a Li concentration is preferably less than or equal to $5\times10^{15}$/cm$^3$, more preferably less than or equal to $1\times10^{15}$/cm$^3$. In a similar manner, a measurement value of a K concentration is preferably less than or equal to $5\times10^{15}$/cm$^3$, more preferably less than or equal to $1\times10^{15}$/cm$^3$.

A highly purified rare gas (typically, argon), highly purified oxygen, or a highly purified mixed gas of oxygen and a rare gas, from which impurities such as hydrogen, water, a compound having a hydroxyl group, and hydride are removed, is used as appropriate as a sputtering gas supplied to a treatment chamber of a sputtering apparatus. For example, the purity of argon is set to 9N (99.9999999%) or higher (the concentration of H$_2$O is 0.1 ppb, and the concentration of H$_2$ is 0.5 ppb), and the dew point thereof is set to −121° C. The oxygen concentration is set to 8N (99.999999%) or higher (the concentration of H$_2$O is 1 ppb, and the concentration of H$_2$ is 1 ppb), and the dew point thereof is set to −112° C. In the case where a mixed gas of the rare gas and oxygen is used, the flow rate ratio of oxygen is preferably high.

An example of the film formation condition is as follows: the distance between the substrate and the target is 100 mm, the pressure is 0.6 Pa, the electric power of the DC power source is 0.5 kW, and oxygen (the flow rate of oxygen is 100%) is used as a sputtering gas. Note that a pulsed direct-current (DC) power supply is preferable because dust generated in deposition can be reduced and the film thickness can be made uniform.

In this manner, the oxide semiconductor layer 342 in which the amount of contained hydrogen is small can be formed. Note that even when the sputtering apparatus is used, the oxide semiconductor layer 342 contains more than a little nitrogen. For example, the nitrogen concentration in the oxide semiconductor layer 342 measured by secondary ion mass spectrometry (SIMS) is lower than $5\times10^{18}$ atoms$^{-3}$.

In order to reduce impurities such as moisture and hydrogen in the oxide semiconductor layer 342 (dehydration or dehydrogenation), the oxide semiconductor layer 342 is preferably subjected to heat treatment. For example, the oxide semiconductor layer 342 is subjected to heat treatment in a reduced-pressure atmosphere, an inert gas atmosphere of nitrogen, a rare gas, or the like, an oxidation gas atmosphere, or an ultra dry air atmosphere (the moisture amount is 20 ppm (−55° C. by conversion into a dew point) or less, preferably 1 ppm or less, more preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide at 10 ppm or higher. The inert gas atmosphere refers to an atmosphere including the oxidation gas at lower than 10 ppm and is filled with nitrogen or a rare gas.

The temperature of the heat treatment is, for example, higher than or equal to 150° C. and lower than the strain point of the substrate, preferably higher than or equal to 250° C. and lower than or equal to 450° C., more preferably higher than or equal to 300° C. and lower than or equal to 450° C. The treatment time is 3 minutes to 24 hours. Heat treatment for longer than 24 hours is not preferable because the productivity is decreased.

There is no particular limitation on a heat treatment apparatus used for the heat treatment, and the apparatus may be provided with a device for heating an object to be processed by heat radiation or heat conduction from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas.

By the heat treatment, hydrogen (water, a compound having a hydroxyl group) can be released from the oxide semiconductor layer 342. Thus, impurities in the oxide semiconductor layer 342 can be reduced.

Furthermore, hydrogen that is an unstable carrier source can be discharged from the oxide semiconductor layer 342 by the heat treatment, whereby the threshold voltage of the transistor can be prevented from being shifted negatively. As a result, the reliability of the transistor can be improved.

Note that the oxide semiconductor layer 342 may have a structure in which a plurality of oxide semiconductor layers are stacked. For example, the oxide semiconductor layer 342 may be a stack of a first oxide semiconductor layer and a second oxide semiconductor layer that are formed using metal oxides with different compositions. For example, the first oxide semiconductor layer may be formed using a three-component metal oxide, and the second oxide semiconductor layer may be formed using a two-component metal oxide. Alternatively, for example, both the first oxide semiconductor layer and the second oxide semiconductor layer may be formed using a three-component metal oxide.

Further, the constituent elements of the first oxide semiconductor layer and the second oxide semiconductor layer may be the same and the composition ratios of the constituent elements of the first oxide semiconductor layer and the second oxide semiconductor layer may be different. For example, the first oxide semiconductor layer may have an atomic ratio of In:Ga:Zn=1:1:1, and the second oxide semiconductor layer may have an atomic ratio of In:Ga:Zn=3:1:2. Alternatively, the first oxide semiconductor layer may have an atomic ratio of In:Ga:Zn=1:3:2, and the second oxide semiconductor layer may have an atomic ratio of In:Ga:Zn=2:1:3.

In this case, one of the first oxide semiconductor layer and the second oxide semiconductor layer which is closer to the gate electrode (on a channel side) preferably contains In and Ga at a proportion satisfying In>Ga. The other which is farther from the gate electrode (on a back channel side) preferably contains In and Ga at a proportion satisfying In≤Ga.

In an oxide semiconductor, the s orbital of heavy metal mainly contributes to carrier transfer, and when the In content in the oxide semiconductor is increased, overlap of the s orbitals is likely to be increased. Therefore, an oxide having a composition where In>Ga has higher mobility than an oxide having a composition where In≤Ga. Further, in Ga, the formation energy of oxygen vacancy is larger and thus oxygen vacancy is less likely to occur, than in In; therefore, the oxide having a composition of In≤Ga has more stable characteristics than the oxide having a composition of In>Ga.

An oxide semiconductor containing In and Ga at a proportion satisfying In>Ga is used on a channel side, and an oxide semiconductor containing In and Ga at a proportion satisfying In≤Ga is used on a back channel side, so that field-effect mobility and reliability of a transistor can be further improved.

Further, oxide semiconductors having different crystallinities may be used for the first oxide semiconductor layer and the second oxide semiconductor layer. That is, the oxide semiconductor layer may be formed using any of a single crystal oxide semiconductor, a polycrystalline oxide semiconductor, an amorphous oxide semiconductor, and a CAAC-OS, as appropriate.

By applying an amorphous oxide semiconductor to at least one of the first oxide semiconductor layer and the second oxide semiconductor layer, internal stress or external stress of the oxide semiconductor layer 342 can be relieved, variation in characteristics of the transistor is reduced, and reliability of the transistor can be further improved.

On the other hand, an amorphous oxide semiconductor is likely to absorb an impurity which serves as a donor, such as hydrogen, and to generate an oxygen vacancy, and thus easily becomes an n-type. Thus, the oxide semiconductor layer on the channel side is preferably formed using a crystalline oxide semiconductor such as a CAAC-OS.

In the case where a channel-etched bottom-gate transistor is used as the transistor, when an amorphous oxide semiconductor is used on a back channel side, oxygen vacancies are generated due to etching treatment at the time of forming a source electrode and a drain electrode; thus, the oxide semiconductor is likely to be n-type. Therefore, in the case of using a channel-etched transistor, an oxide semiconductor having crystallinity is preferably used for an oxide semiconductor layer on a back channel side.

Further, the oxide semiconductor layer 342 may have a stacked structure of three or more layers in which an amorphous oxide semiconductor layer is interposed between a plurality of oxide semiconductor layers each having crystallinity. Furthermore, a structure in which an oxide semiconductor layer having crystallinity and an amorphous oxide semiconductor layer are alternately stacked may be employed.

These two structures used so that the oxide semiconductor layer 342 has a stacked-layer structure including a plurality of layers can be combined as appropriate.

Figure 10B:
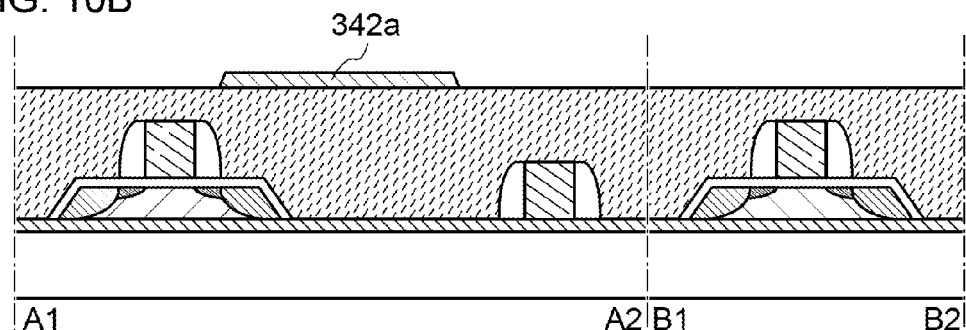

Next, a resist mask is formed through a photolithography method over the oxide semiconductor layer 342, and the oxide semiconductor layer 342 is etched to have a desired shape with the use of the resist mask; in this manner, an island-shaped oxide semiconductor layer 342a is formed (see FIG. 10B).

Note that a process in which a resist mask having an appropriate shape is formed over a conductive layer or an insulating layer by a photolithography method is referred to as a photolithography process; in general, after the formation of the resist mask, an etching step and a separation step of the resist mask are performed in many cases. Thus, unless otherwise specified, a photolithography process in this specification includes a step of forming a resist mask, a step of etching a conductive layer or an insulating layer, and a step of removing the resist mask.

Note that the oxide semiconductor layer 342 may be etched using either dry etching or wet etching, or using both dry etching and wet etching. In the case where the oxide semiconductor layer 342 is etched by a wet etching method, a solution obtained by mixing phosphoric acid, acetic acid, and nitric acid, a solution containing oxalic acid, or the like can be used as the etchant. Alternatively, ITO-07N (produced by KANTO CHEMICAL CO., INC.) may be used. In the case where the oxide semiconductor layer 342 is etched by a dry etching method, for example, a dry etching method using a high-density plasma source such as ECR or ICP can be used.

The etching of the oxide semiconductor layer 342 is preferably performed to form the island-shaped oxide semiconductor layer 342a having an end portion with a tapered shape. With the structure, a layer provided to cover the end portion of the oxide semiconductor layer 342a can be prevented from being separated, which achieves an improvement in the coverage with a layer formed over the oxide semiconductor layer 342a.

Note that in this embodiment, the case where the heat treatment is performed directly after the oxide semiconductor layer 342 is formed is described; however, the heat treatment may be performed after the oxide semiconductor layer 342 is processed into the island-shaped oxide semiconductor layer 342a.

Next, the insulating layer 324 is subjected to a photolithography process and part of the insulating layer 324 selectively etched to form an opening 325 reaching the electrode 313.

Figure 10C:
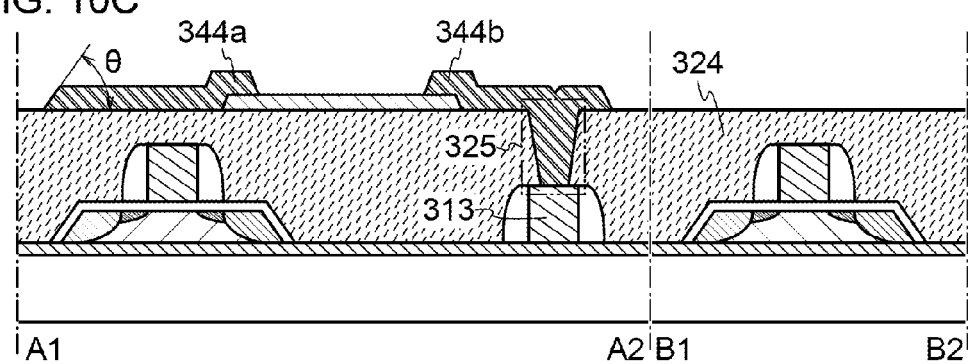

Next, a conductive layer 343 (not illustrated) is formed over the oxide semiconductor layer 342a and the like, and then the conductive layer 343 is subjected to a photolithography process and etched into a desired shape to form a source electrode 344a and a drain electrode 344b (see FIG. 10C). The source electrode 344a functions as one of a pair of electrodes of the capacitor. In addition, the drain electrode 344b is electrically connected to the electrode 313 through the opening 325.

The conductive layer 343 can be formed by a sputtering method, a vacuum evaporation method, or a plating method. The conductive layer 343 can be formed using a metal material selected from aluminum (Al), chromium (Cr), copper (Cu), tantalum (Ta), titanium (Ti), molybdenum (Mo), tungsten (W), neodymium (Nd), and scandium (Sc); an alloy material containing the above metal element; a nitride material of the above metal element; or the like. Further, a material containing one or more metal elements selected from manganese (Mn), magnesium (Mg), zirconium (Zr), and beryllium (Be) may be used.

In addition, a conductive layer used to form the source electrode 344a and the drain electrode 344b may have a single-layer structure or a stacked structure of two or more layers. Examples thereof are a single-layer structure using aluminum containing silicon, a two-layer structure in which titanium is stacked over aluminum, a two-layer structure in which titanium is stacked over a titanium nitride, a two-layer structure in which tungsten is stacked over a titanium nitride, a two-layer structure in which tungsten is stacked over a tantalum nitride, a two-layer structure in which copper is stacked over a Cu—Mg—Al alloy, a three-layer structure in which a titanium nitride, copper, and tungsten are stacked in this order, and a three-layer structure in which tungsten, copper, and a titanium nitride are stacked in this order. With use of copper for the conductive layer which is to be the electrode, wiring resistance of the electrode can be reduced. Alternatively, copper is stacked with a refractory metal such as tungsten, molybdenum, and tantalum, or a nitride of the metal, whereby diffusion of copper to another layer can be prevented. Note that the conductive layer 343 having a single-layer structure of a titanium layer or a titanium nitride layer has an advantage in that the end portions of the source electrode 344a and the drain electrode 344b can be easily processed to have a tapered shape.

For the conductive layer 343, indium oxide, indium oxide-tin oxide (also referred to as ITO), indium oxide-zinc oxide, zinc oxide, zinc oxide to which gallium is added, graphene, or the like can be used. As the etching performed on the conductive layer 343, a dry etching method or a wet etching method can be used. Further, the etching may be performed by a combination of a dry etching method and a wet etching method.

In the case of etching the conductive layer 343 by a dry etching method, a gas including a halogen element can be used as an etching gas. As an example of a gas containing a halogen element, a chlorine-based gas such as chlorine ($Cl_2$), boron trichloride ($BCl_3$), silicon tetrachloride ($SiCl_4$), or carbon tetrachloride ($CCl_4$)); a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr), or oxygen can be given. Further, an inert gas may be added to an etching gas. As the dry etching method, a reactive ion etching (RIE) method can be used.

As a plasma source, a capacitively coupled plasma (CCP), an inductively coupled plasma (ICP), an electron cyclotron resonance (ECR) plasma, a helicon wave plasma (HWP), a microwave-excited surface wave plasma (SWP), or the like can be used. In particular, with ICP, ECR, HWP, and SWP, a high density plasma can be generated. In the case of the etching according to the dry etching method (hereinafter also referred to as a "dry etching treatment"), the etching conditions (the amount of electric power applied to a coil-shaped electrode, the amount of electric power applied to an electrode on a substrate side, the temperature of the electrode on the substrate side, and the like) are adjusted as appropriate so that the film can be etched into a desired shape.

Next, part of the conductive layer 343 is selectively etched to form the source electrode 344a and the drain electrode 344b (and another electrode or wiring which is formed of the same layer as the source electrode 344a and the drain electrode 344b). Specifically, the end portion has a taper angle θ (see FIG. 10C) of 80° or less, preferably 60° or less, further preferably 45° or less. Note that the taper angle q refers to an inclination angle formed by the side surface and bottom surface of the layer having a taper shape when the layer is seen from the direction perpendicular to the cross section of the layer (i.e., the plane perpendicular to the surface of the substrate). A taper angle smaller than 90° is called forward tapered angle and a taper angle of larger than or equal to 90° is called inverse tapered angle.

Alternatively, the cross-sectional shape of the end portions of the source electrode 344a and the drain electrode 344b has a plurality of steps, so that the coverage with the layer formed thereon can be improved. The above is not limited to the source electrode 344a and the drain electrode 344b, and by providing a forward taper shape or a step-like shape for a cross section of an end portion of each layer, a phenomenon in that a layer formed over the end portion is separated (disconnection) can be prevented, so that the coverage becomes good.

Figure 10D:
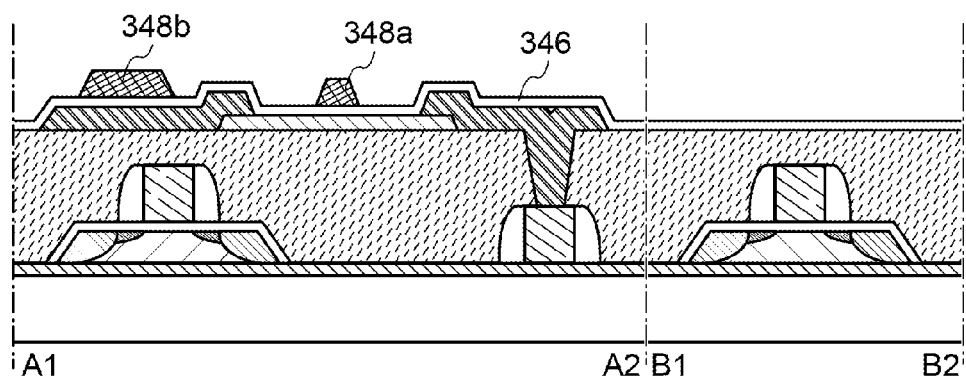

Next, a gate insulating layer 346 is formed to cover the source electrode 344a, the drain electrode 344b, and the oxide semiconductor layer 342a (see FIG. 10D).

The gate insulating layer 346 can be formed using silicon oxide, silicon nitride, silicon oxynitride, gallium oxide, aluminum oxide, tantalum oxide, or the like. Alternatively, the gate insulating layer 346 can be formed using a material with a high dielectric constant (a high-k material) such as hafnium oxide, yttrium oxide, hafnium silicate ($HfSi_xO_y$, (x>0, y>0)), hafnium silicate to which nitrogen is added ($HfSi_xO_yN_z$ (x>0, y>0, z>0)), or hafnium aluminate to which nitrogen is added ($HfAl_xO_yN_z$ (x>0, y>0, z>0)). The gate insulating layer 346 has either a single-layer structure or a stacked-layer structure in which these materials are combined. There is no particular limitation on the thickness of the gate insulating layer 346; in the case where the memory device is miniaturized, the gate insulating layer 346 is preferably thin in order to ensure the operation of the transistor. For example, in the case where silicon oxide is used, the thickness can be set to greater than or equal to 1 nm and less than or equal to 100 nm, preferably greater than or equal to 10 nm and less than or equal to 50 nm.

A material containing the same kind of component as the oxide semiconductor of the oxide semiconductor layer 342a is preferably used for the gate insulating layer 346. This is because such a material is compatible with the oxide semiconductor, and therefore, the use of such a material for a layer in contact with the oxide semiconductor enables a state of the interface between the semiconductor layer and the layer to be kept well. Here, containing "the same kind of component as the oxide semiconductor" means containing one or more of elements selected from constituent elements of the oxide semiconductor. For example, in the case where the oxide semiconductor is formed using an In—Ga—Zn-based oxide semiconductor material, gallium oxide, gallium oxide zinc, and the like are given as an insulating material containing the same kind of component as the oxide semiconductor.

As a preferable example of a stacked-layer structure for the gate insulating layer 346, a stacked-layer structure of a layer a formed using the insulating material containing the same kind of component as the oxide semiconductor and a layer b formed using a material different from the component material of the layer a can be given. For example, in the case where the oxide semiconductor is formed using an In—Ga—Zn-based oxide semiconductor material, the layer a in contact with the oxide semiconductor and the layer b may be formed using gallium oxide and silicon oxynitride, respectively.

Note that a similar effect can be obtained in the case where an element in the same group as a constituent element of the oxide semiconductor layer 342a is used in the gate insulating layer 346. For example, it is effective to form the gate insulating layer 346 with the use of a material containing aluminum oxide. Note that water is less likely to permeate an aluminum oxide. Thus, it is preferable to use a material containing an aluminum oxide in terms of preventing entry of water to the oxide semiconductor layer.

By the heat treatment performed on the oxide semiconductor layer 342 (or the oxide semiconductor layer 342a), oxygen in the oxide semiconductor layer 342 is released together with hydrogen. When oxygen is released from the oxide semiconductor layer 342, oxygen deficiency is caused therein. Part of the oxygen deficiency becomes a donor, which leads to generation of carriers in the oxide semiconductor layer 342. As a result, characteristics of the transistor might be affected.

Therefore, an insulating layer from which oxygen is discharged by heat treatment is preferably used as the gate insulating layer 346 in contact with the oxide semiconductor layer 342a.

In this specification and the like, "oxygen is eliminated by heat treatment" means that the amount of eliminated oxygen (or released oxygen) which is converted into oxygen atoms is greater than or equal to $1.0 \times 10^{18}$ atoms/cm$^3$, preferably greater than or equal to $3.0 \times 10^{20}$ atoms/cm$^3$ according to thermal desorption spectroscopy (TDS). In contrast, "oxygen is not eliminated by heat treatment" means that the amount of eliminated oxygen (or released oxygen) which is converted into oxygen atoms is less than $1.0 \times 10^{18}$ atoms/cm$^3$ according to TDS.

A method for quantifying the amount of released oxygen which is converted into oxygen atoms, with the use of TDS analysis will be described below.

The amount of released gas in TDS analysis is proportional to the integral value of ion intensity. Therefore, the amount of discharged gas can be calculated from the ratio between the integral value of ion intensity of an insulating layer and the reference value of a standard sample. The reference value of a standard sample refers to the ratio of the density of a predetermined atom contained in a sample to the integral value of ion intensity.

For example, the number of the released oxygen molecules ($N_{O2}$) from an insulating layer can be found according to Equation 3 with the TDS analysis results of a silicon wafer containing hydrogen at a predetermined density which is the standard sample and the TDS analysis results of the insulating layer. Here, all gases having a mass number of 32 which are obtained in the TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2} = N_{H2}/S_{H2} \times S_{O2} \times \alpha \quad \text{(Equation 3)}$$

$N_{H2}$ is the value obtained by conversion of the number of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating layer is subjected to TDS analysis. $\alpha$ is a coefficient affecting the ion intensity in the TDS analysis. Japanese Published Patent Application No. H6-275697 can be referred to for details of the above formula. Note that the above-mentioned value of the amount of eliminated oxygen was obtained with a thermal desorption spectroscopy apparatus produced by ESCO Ltd., EMD-WA1000S/W and with a silicon wafer containing hydrogen atoms at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of oxygen molecules, the number of the released oxygen atoms can also be estimated through the evaluation of the number of the released oxygen molecules.

Note that $N_{O2}$ is the number of released oxygen molecules. In the insulating layer, the amount of eliminated oxygen which is converted into oxygen atoms is twice the number of eliminated oxygen molecules.

An example of a film from which oxygen is eliminated by heat treatment is a film of silicon oxide containing excess oxygen ($SiO_x(x>2)$). In the oxygen-excess silicon oxide ($SiO_x$ (x>2)), the number of oxygen atoms per unit volume is more than twice the number of silicon atoms per unit volume. The number of silicon atoms and the number of oxygen atoms per unit volume are measured by Rutherford backscattering spectrometry.

An insulating layer from which oxygen is discharged by heat treatment is used as an insulating layer in contact with the oxide semiconductor layer 342a (for example, the insulating layer 324, the gate insulating layer 346), and is subjected to heat treatment in any of steps after the formation of the gate insulating layer 346, so that oxygen is discharged from the insulating layer 324 and the gate insulating layer 346 to be supplied to the oxide semiconductor layer 342a. Consequently, oxygen deficiency generated in the oxide semiconductor layer 342a can be compensated for and can be reduced. Therefore, generation of carriers in the oxide semiconductor layer 342a can be suppressed, whereby variation in electric characteristics of the transistor can be suppressed.

Next, a conductive layer 348 (not illustrated) is formed over the gate insulating layer 346, and then the conductive layer 348 is subjected to a photolithography process and etched into a desired shape to form a gate electrode 348a and an electrode 348b (including another electrode and wiring formed using the same layer as the gate electrode 348a and the electrode 348b) (see FIG. 10D). The electrode 348b functions as an electrode of the capacitor.

The conductive layer 348 can be formed using a material and a method similar to those of the conductive layer 343. Alternatively, a semiconductor typified by polycrystalline silicon including an impurity element such as phosphorus, or silicide such as nickel silicide may be used.

Alternatively, the conductive layer 348 can be formed using a conductive material containing oxygen such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Alternatively, a stacked structure of the above conductive material containing oxygen and a material containing another metal element may be employed.

In order to obtain a normally-off switching element, it is preferable that the threshold voltage of the transistor is made positive by using a material having a work function of 5 eV (electron volts) or higher, preferably 5.5 eV or higher, for the conductive layer 348 used to form the gate electrode 348a. Specifically, a material which includes an In—N bond and has a specific resistivity of $1\times10^{-1}$ Ω·cm to $1\times10^{-4}$ Ω·cm, preferably $5\times10^{-2}$ Ω·cm to $1\times10^4$ Ω·cm, is used for the conductive layer 348. Examples of the material are In—Ga—Zn-based oxide containing nitrogen, In—Sn-based oxide containing nitrogen, In—Ga-based oxide containing nitrogen, In—Zn-based oxide containing nitrogen, In-based oxide containing nitrogen, and metal nitride (e.g., an InN). As the etching performed on the conductive layer 348, a dry etching method or a wet etching method can be used. Further, the etching may be performed by a combination of a dry etching method and a wet etching method.

Figure 11A:
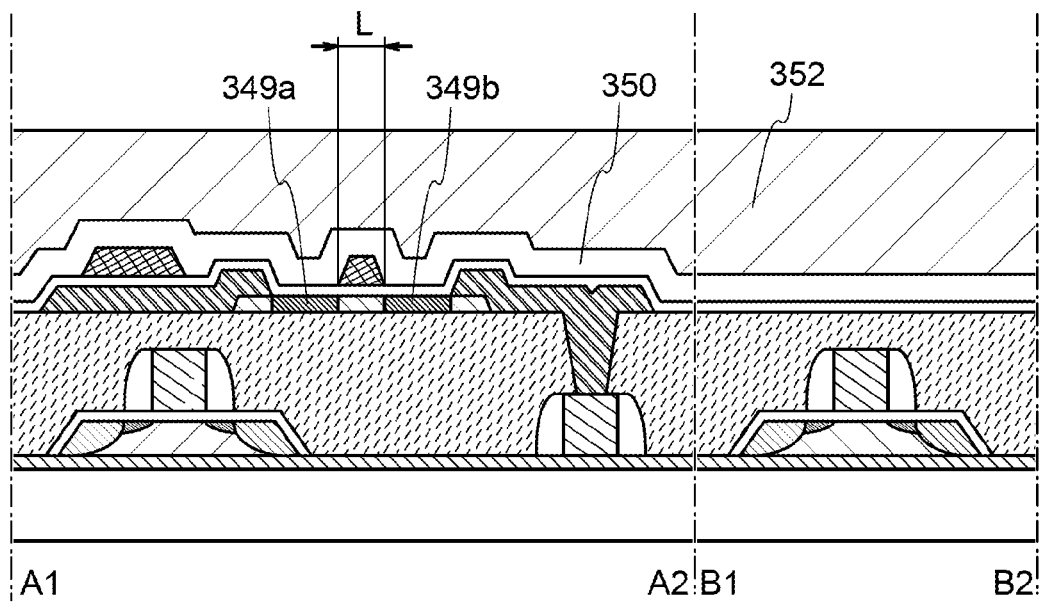
FIGS. 11A and 11B illustrate a method for manufacturing a memory device.

After the gate electrode 348a and the electrode 348b are formed, a dopant imparting n-type conductivity is added to the oxide semiconductor layer 342a with the use of the gate electrode 348a, the source electrode 344a, and the drain electrode 344b as masks; in this manner, a pair of dopant regions 349a and 349b are formed (see FIG. 11A). In the oxide semiconductor layer 342a, a region between the dopant region 349a and the dopant region 349b serves a channel formation region.

The channel formation region in the oxide semiconductor layer 342a overlaps with the gate electrode 348a with the gate insulating layer 346 laid therebetween. That is, the channel length (L) of the transistor is determined by the length in a direction of the source and the drain of the gate electrode 348a (see FIG. 11A). Note that in light exposure for forming a resist mask for a transistor with a channel length (L) less than 30 nm, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor can be in the range of greater than or equal to 10 nm and less than or equal to 1000 nm (1 mm), and the circuit can operate at higher speed. Moreover, miniaturization can lead to low power consumption of a semiconductor device.

Further, in the case of forming a transistor having a channel length (L) of less than 30 nm, a resist mask can also be formed with an electron beam drawing equipment (also referred to as electron beam (EB) lithography system). An EB lithography system enables extremely minute processing, and thus is suitable for manufacturing a miniaturized transistor.

The addition of the dopant for forming the dopant regions 349a and 349b can be performed by an ion implantation method. As the dopant, for example, a rare gas such as helium, argon, or xenon, a Group 15 element such as nitrogen, phosphorus, arsenic, or antimony, or the like can be used. For example, in the case where nitrogen is used as the dopant, the concentration of nitrogen atoms in the dopant regions 349a and 349b is preferably higher than or equal to $5\times10^{19}/cm^3$ and lower than or equal to $1\times10^{22}/cm^3$. The dopant regions 349a and 349b to which the dopant imparting n-type conductivity is added have higher conductivity than the other regions in the oxide semiconductor layer 342a. Therefore, by providing the dopant regions 349a and 349b in the oxide semiconductor layer 342a, the resistance between the source electrode 344a and the drain electrode 344b can be decreased.

Then, an insulating layer 350 and an insulating layer 352 are formed over the gate insulating layer 346, the gate electrode 348a, and the electrode 348b (see FIG. 11A). The insulating layers 350 and 352 can be formed by a PVD method, a CVD method, or the like. The insulating layers 350 and 352 can be formed using a material containing an inorganic insulating material such as silicon oxide, silicon oxynitride, silicon nitride, hafnium oxide, gallium oxide, or aluminum oxide, or a material containing an organic material such as polyimide or acrylic. Note that for the insulating layers 350 and 352, a material with a low dielectric constant or a structure with a low dielectric constant (e.g., a porous structure) is preferably used. This is because when the insulating layers 350 and 352 have a low dielectric constant, capacitance generated between wirings, electrodes, or the like can be reduced and operation at higher speed can be achieved. For example, a material containing an inorganic material can be used for the insulating layer 350 and a material containing an organic material can be used for the insulating layer 352.

An aluminum oxide film has a property of blocking hydrogen, water, and the like. Therefore, the insulating layer 350 is preferably formed using an aluminum oxide film in order to prevent hydrogen, water, and the like from entering the oxide semiconductor layer 342a from the outside of the semiconductor device. Further, an aluminum oxide film also has a property of blocking oxygen, so that outward diffusion of oxygen contained in the oxide semiconductor layer 342a can be suppressed. The use of an aluminum oxide film for the insulating layer 350 not only can prevent hydrogen, water, and the like from entering the oxide semiconductor layer 342a but also can suppress outward diffusion of oxygen contained in the oxide semiconductor layer 342a.

Next, an opening 355 reaching the drain electrode 344b is formed to penetrate the gate insulating layer 346, the insulating layer 350, and the insulating layer 352. The opening 355 can be formed through a photolithography process. After that, a conductive layer is formed in contact with the drain electrode 344b. Next, the conductive layer is subjected to etching or CMP treatment to form an electrode 354 (see FIG. 11B).

Figure 11B:
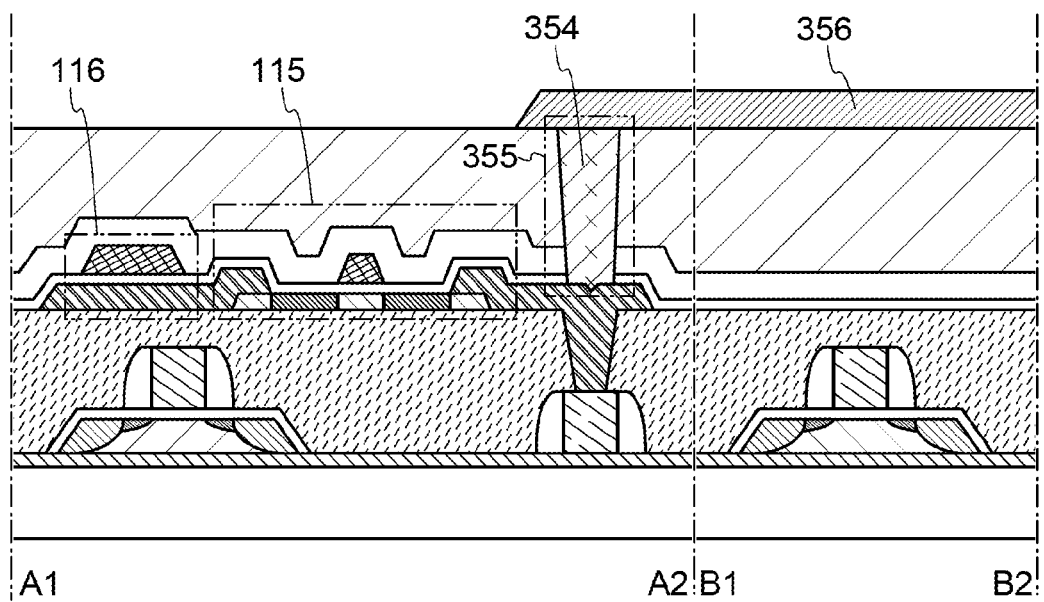

Next, a wiring 356 is formed over the insulating layer 352 to be in contact with the electrode 354 (see FIG. 11B). The electrode 354 and the wiring 356 can be formed using a material and a method which are similar to those of the gate electrode 348a, the source electrode 344a, and the like.

Alternatively, the wiring 356 and the drain electrode 344b may be connected through the opening 355 and the electrode 354 may be omitted. A thin titanium film may be formed in a region including the opening 325 by a PVD method before the formation of the electrode 354 and then the electrode 354 or the drain electrode 344b may be formed. Here, the titanium film formed by a PVD method has a function of reducing an oxide film (such as a natural oxide film) over which the titanium layer is to be formed, and thereby lowering contact resistance with the lower electrode or the like (here, the drain electrode 344b). In addition, by stacking a titanium layer and an aluminum layer, hillock of an aluminum layer can be prevented. After a barrier layer formed using titanium, titanium nitride, or the like is formed, a copper film can be formed by plating.

The gate electrode 312a of the transistor 113, the gate electrode 312b of the transistor 111, and the electrode 313 are electrically connected one another. The gate electrode 312a of the transistor 113 and the gate electrode 312b of the transistor 111 are electrically connected to the drain electrode 344b of the transistor 115. Note that the transistor 111, the transistor 113, and the transistor 115 can also be connected to other transistor and terminal which are not illustrated through the wiring 356.

By the above manufacturing method, the transistor 111, the transistor 113, and the transistor 115 included in the memory element 110 can be formed (see FIG. 11B). Note that the transistor 112, the transistor 114, and the transistor 117 included in the memory element 110 can be formed in a similar manner and at the same time as the transistor 111, the transistor 113, the transistor 115, and the like.

By the above manufacturing method, the semiconductor device in which the transistor including an oxide semiconductor material is formed over the transistor including a semiconductor material other than an oxide semiconductor can be manufactured.

By the above manufacturing method, the oxide semiconductor layer 342a in which the amount of impurities such as hydrogen and an alkali metal is extremely small can be obtained. The hydrogen concentration in the oxide semiconductor layer 342a can be $5\times10^{19}$ atoms/cm$^3$ or lower, preferably $5\times10^{18}$ atoms/cm$^3$ or lower, more preferably $5\times10^{17}$ atoms/cm$^3$ or lower, for example. Further, as for the concentration of impurities such as Li and Na which are alkali metals and Ca which is an alkaline earth metal in the oxide semiconductor layer 342a, specifically, a measurement value of a Na concentration by secondary ion mass spectrometry is preferably less than or equal to $5\times10^{16}$/cm$^3$, more preferably less than or equal to $1\times10^{16}$/cm$^3$, still more preferably less than or equal to $1\times10^{15}$/cm$^3$. In a similar manner, a measurement value of a Li concentration is preferably less than or equal to $5\times10^{15}$/cm$^3$, more preferably less than or equal to $1\times10^{15}$/cm$^3$. In a similar manner, the measurement value of a K concentration can be preferably less than or equal to $5\times10^{15}$/cm$^3$, preferably less than or equal to $1\times10^{15}$/cm$^3$.

A transistor including the oxide semiconductor layer 342a as a semiconductor layer in which a channel is formed can have an extremely low off-state current. Specifically, off-state current per micrometer in channel width can be lower than or equal to 100 zA, preferably lower than or equal to 10 zA. This value of off-state current is much lower than the off-state current density of a transistor having crystalline silicon in a semiconductor layer in which a channel is formed. The transistor 115 including an oxide semiconductor in the semiconductor layer in which a channel is formed has an extremely low off-state current; therefore, data saved on the memory circuits 102 and 103 in the memory element 110 illustrated in FIGS. 1A and 1B can be held for a long time.

The transistor according to this embodiment has relatively high field-effect mobility; therefore, with the use of the transistor as the transistor 115 and the transistor 117 illustrated in FIGS. 1A and 1B, the memory circuit 102 and the memory circuit 103 can operate at high speed. Accordingly, in the semiconductor device illustrated in FIGS. 1A and 1B, data can be transferred from the logic circuit 101 to the memory circuit 102 and the memory circuit 103 in a short time, before supply of power is stopped. Further, after the supply of power is restarted, data can be restored from the memory circuit 102 and the memory circuit 103 to the logic circuit 101 in a short time.

In the memory element according to one embodiment of the present invention, the memory circuits 102 and 103 which include the transistors 115 and 117, respectively, including an oxide semiconductor in the semiconductor layer in which a channel is formed can be formed over the logic circuit 101 which includes a transistor including a semiconductor other than an oxide semiconductor in a semiconductor layer in which a channel is formed. As described above, the transistors 115 and 117 including an oxide semiconductor in the semiconductor layer in which a channel is formed can be formed over the transistor including a semiconductor other than an oxide semiconductor in a semiconductor layer in which a channel is formed; thus, the memory element can be formed three-dimensionally. Therefore, the area of the memory element can be decreased.

A magnetic tunneling junction element (an MTJ element) is known as a non-volatile random access memory. The MTJ element stores data in a low resistance state when the spin directions in magnetic films provided above and below an insulating film are parallel, and stores data in a high resistance state when the spin directions are anti-parallel. Therefore, the principles of the MTJ element and the memory element according to one embodiment of the present invention are completely different from each other. Table 1 shows comparison between the MTJ element and the memory element according to one embodiment of the present invention.

TABLE 1

|  | Spintronics (MTJ element) | OS/Si |
| --- | --- | --- |
| 1) Heat resistance | Curie temperature | Process temperature at 500° C. (reliability at 150° C.) |
| 2) Driving method | Current driving | Voltage driving |
| 3) Writing principle | Changing the spin direction of magnetic film | Turning on/off FET |
| 4) Si LSI | Suitable for bipolar LSI (For highly integrated circuit, MOS LSI is preferable to bipolar LSI, which is unsuitable for high integration. Note that W becomes larger.) | Suitable for MOS LSI |
| 5) Overhead | Large (because of high Joule heat) | Smaller than overhead of MTJ element by 2 to 3 or more orders of magnitude (because of utilizing charging and discharging of parasitic capacitance) |
| 6) Nonvolatility | Utilizing spin | Utilizing low off-state current |
| 7) Cycles capable of holding electric charge | No limitation | No limitation |
| 8) 3D structure | Difficult (at most two layers) | Easy (with a limitless number of layers) |
| 9) Integration degree ($F^2$) | 4 $F^2$ to 15 $F^2$ | Depending on the number of layers stacked in 3D structure (need heat resistance high enough to withstand process of forming upper OS FET) |
| 10) Material | Magnetic rare-earth element | Oxide semiconductor material |
| 11) Cost per bit | High | Low (might be slightly high depending on constituent of oxide semiconductor (e.g., In)) |
| 12) Resistance to magnetic field | Low | High |
| 13) Amount of Electric Power Consumed for Writing Operation | 250 fJ/bit | 0.6 fJ/bit |

The MTJ element has a disadvantage in that a magnetic property is lost when the temperature is higher than or equal to the Curie temperature because a magnetic material is used. In addition, the MTJ element is compatible with a silicon bipolar device because current driving is employed; however, the bipolar device is unsuitable for high integration. Further, there is a problem in that power consumption is increased by an increase of memory capacity, though the writing current of the MTJ element is extremely low.

In principle, the MTJ element has low resistance to a magnetic field, so that the magnetization direction is likely to change when the MTJ element is exposed to a high magnetic field. In addition, it is necessary to control magnetic fluctuation which is caused by nanoscaling of a magnetic body used for the MTJ element.

In addition, a rare earth element is used for the MTJ element; thus, it requires special attention to incorporate a process of forming the MTJ element in a process of forming a silicon semiconductor that avoids metal contamination. The material cost per bit of the MTJ element is expensive.

On the other hand, the transistor including an oxide semiconductor in this embodiment has an element structure and an operation principle which are similar to those of a silicon MOSFET except that the region in which the channel is formed includes a metal oxide. Further, the transistor including an oxide semiconductor is not affected by a magnetic field, and does not cause soft errors. This shows that the transistor is highly compatible with a silicon integrated circuit.

The methods and structures described in one of this embodiment can be combined as appropriate with any of the methods and structures described in the other embodiments.

Embodiment 4

In this embodiment, as another example of the transistor, a transistor including an oxide semiconductor for a semiconductor layer in which a channel is formed will be described.

Figure 12A:
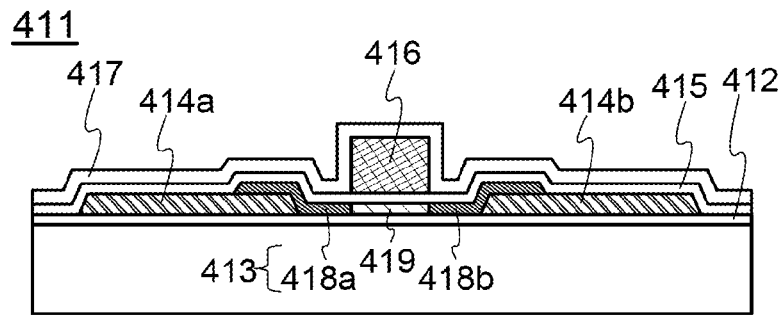
FIGS. 12A to 12D are cross-sectional views of a structure of a transistor.

A transistor 411 illustrated in FIG. 12A includes a source electrode 414a and a drain electrode 414b which are formed over a base layer 412, an oxide semiconductor layer 413 which is formed over the source electrode 414a and the drain electrode 414b, a gate insulating layer 415 over the oxide semiconductor layer 413, the source electrode 414a, and the drain electrode 414b, a gate electrode 416 provided over the gate insulating layer 415 so as to overlap with the oxide semiconductor layer 413, and a protective insulating layer 417 provided over the gate electrode 416 and covering the oxide semiconductor layer 413.

The transistor 411 illustrated in FIG. 12A has a top-gate structure where the gate electrode 416 is formed over the oxide semiconductor layer 413, and has a bottom-contact structure where the source electrode 414a and the drain electrode 414b are formed below the oxide semiconductor layer 413. In addition, the gate electrode 416 do not overlap with the source electrode 414a nor the drain electrode 414b in the transistor 411; thus, parasitic capacitances between the gate electrode 416 and the source electrode 414a and between the gate electrode 416 and the drain electrode 414b can be made low, so that high-speed operation can be achieved.

The oxide semiconductor layer 413 includes a pair of dopant regions 418a and 418b which are obtained by addition of a dopant imparting n-type conductivity to the oxide semiconductor layer 413 after formation of the gate electrode 416. Further, in the oxide semiconductor layer 413, a region with which the gate electrode 416 overlaps with the gate insulating layer 415 laid therebetween is a channel formation region 419. In the oxide semiconductor layer 413, the channel formation region 419 is provided between the pair of dopant regions 418a and 418b. The addition of the dopant for forming the dopant regions 418a and 418b can be performed by an ion implantation method. A rare gas such as helium, argon, or xenon, nitrogen, phosphorus, arsenic, antimony, boron, or the like can be used as the dopant, for example.

For example, in the case where nitrogen is used as the dopant, the concentration of nitrogen atoms in the dopant regions 418a and 418b is preferably higher than or equal to $5\times10^{19}/cm^3$ and lower than or equal to $1\times10^{22}/cm^3$.

The dopant regions 418a and 418b to which the dopant imparting n-type conductivity is added have higher conductivity than the other regions in the oxide semiconductor layer 413. Therefore, by providing the dopant regions 418a and 418b in the oxide semiconductor layer 413, the resistance between the source electrode 414a and the drain electrode 414b can be decreased.

In the case where an In—Ga—Zn-based oxide semiconductor is used for the oxide semiconductor layer 413, heat treatment is performed at a temperature higher than or equal to 300° C. and lower than or equal to 600° C. after nitrogen is added. Consequently, the oxide semiconductor in the dopant regions 418a and 418b has a wurtzite crystal structure. When the oxide semiconductor in the source electrode 414a and the drain electrode 414b has a wurtzite crystal structure, the conductivity of the dopant regions 418a and 418b can be further increased and the resistance between the source electrode 414a and the drain electrode 414b can be decreased. Note that in order to effectively decrease the resistance between the source electrode 414a and the drain electrode 414b by forming the oxide semiconductor having a wurtzite crystal structure, when nitrogen is used as a dopant, the nitrogen atom concentration in the dopant regions 418a and 418b is preferably higher than or equal to $1\times10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor layer 413 may be a CAAC-OS layer. When the oxide semiconductor layer 413 is a CAAC-OS layer, the conductivity of the oxide semiconductor layer 413 can be higher than that in the case of using an amorphous oxide semiconductor layer; therefore, the resistance between the source electrode 414a and the drain electrode 414b can be reduced.

By reducing the resistance between the source electrode 414a and the drain electrode 414b, a high on-state current and high-speed operation can be ensured even when the transistor 411 is miniaturized. In addition, by miniaturization of the transistor 411, the area of a semiconductor device including the transistor can be reduced, so that the number of transistors per unit area can be increased.

Figure 12B:
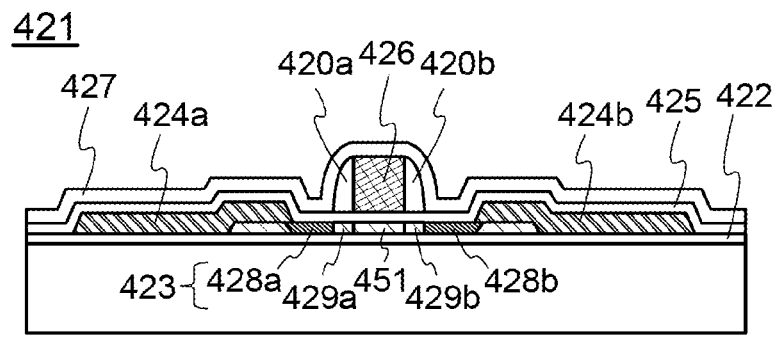

A transistor 421 illustrated in FIG. 12B includes an oxide semiconductor layer 423 formed over a base layer 422, a source electrode 424a and a drain electrode 424b which are formed over the oxide semiconductor layer 423, a gate insulating layer 425 over the oxide semiconductor layer 423, the source electrode 424a, and the drain electrode 424b, a gate electrode 426 provided over the gate insulating layer 425 so as to overlap with the oxide semiconductor layer 423, and a protective insulating layer 427 provided over the gate electrode 426 and covering the oxide semiconductor layer 423. The transistor 421 further includes sidewalls 420a and 420b provided on side surfaces of the gate electrode 426 and formed using an insulating layer.

The transistor 421 illustrated in FIG. 12B has a top-gate structure where the gate electrode 426 is formed over the oxide semiconductor layer 423, and has a top-contact structure where the source electrode 424a and the drain electrode 424b are formed above the oxide semiconductor layer 423. In addition, as in the transistor 411, the gate electrode 426 do not overlap with the source electrode 424a nor the drain electrode 424b in the transistor 421; thus, parasitic capacitances between the gate electrode 426 and the source electrode 424a and between the gate electrode 426 and the drain electrode 424b can be made low, so that high-speed operation can be achieved.

The oxide semiconductor layer 423 includes a pair of high-concentration dopant regions 428a and 428b and a pair of low-concentration dopant regions 429a and 429b which are obtained by addition of dopants imparting n-type conductivity to the oxide semiconductor layer 423 after formation of the gate electrode 426. Further, in the oxide semiconductor layer 423, a region with which the gate electrode 426 overlaps with the gate insulating layer 425 laid therebetween is a channel formation region 451. In the oxide semiconductor layer 423, the pair of low-concentration dopant regions 429a and 429b are provided between the pair of high-concentration dopant regions 428a and 428b, and the channel formation region 451 is provided between the pair of low-concentration dopant regions 429a and 429b. The pair of low-concentration dopant regions 429a and 429b are provided in regions which are included in the oxide semiconductor layer 423 and overlap with the sidewalls 420a and 420b with the gate insulating layer 425 laid therebetween.

Similarly to the dopant regions 418a and 418b included in the transistor 411, the high-concentration dopant regions 428a and 428b and the low-concentration dopant regions 429a and 429b can be formed by an ion implantation method. The description of the dopant regions 418a and 428b can be referred to for the kind of the dopant for forming the high-concentration dopant regions 418a and 418b.

For example, in the case where nitrogen is used as the dopant, the concentration of nitrogen atoms in the high-concentration dopant regions 428a and 428b is preferably higher than or equal to $5\times10^{19}/cm^3$ and lower than or equal to $1\times10^{22}/cm^3$. Further, for example, in the case where nitrogen is used as the dopant, the concentration of nitrogen atoms in the low-concentration dopant regions 429a and 429b is preferably higher than or equal to $5\times10^{18}/cm^3$ and lower than or equal to $5\times10^{19}/cm^3$.

The high-concentration dopant regions 428a and 428b to which the dopant imparting n-type conductivity is added have higher conductivity than the other regions in the oxide semiconductor layer 423. Therefore, by providing the high-concentration dopant regions 428a and 428b in the oxide semiconductor layer 423, the resistance between the source electrode 424a and the drain electrode 424b can be decreased. Further, the low-concentration dopant regions 429a and 429b are provided between the channel formation region 451 and the high-concentration dopant regions 428a and 428b, which results in a reduction in negative shift of a threshold voltage due to a short-channel effect.

In the case where an In—Ga—Zn-based oxide semiconductor is used for the oxide semiconductor layer 423, heat treatment is performed at a temperature higher than or equal to 300° C. and lower than or equal to 600° C. after nitrogen is added. Consequently, the oxide semiconductor in the high-concentration dopant regions 428a and 428b has a wurtzite crystal structure. Further, depending on the nitrogen concentration, the low-concentration dopant regions 429a and 429b also have a wurtzite crystal structure due to the heat treatment. When the oxide semiconductor in the source electrode 424a and the drain electrode 424b has a wurtzite crystal structure, the conductivity of the high-concentration dopant regions 428a and 428b can be further increased and the resistance between the source electrode 424a and the drain electrode 424b can be decreased. Note that in order to effectively decrease the resistance between the source electrode 424a and the drain electrode 424b by forming the oxide semiconductor having a wurtzite crystal structure, when nitrogen is used as a dopant, the nitrogen atom concentration in the high-concentration dopant regions 428a and 428b is preferably higher than or equal to $1 \times 10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor layer 423 may be a CAAC-OS layer. When the oxide semiconductor layer 423 is a CAAC-OS layer, the conductivity of the oxide semiconductor layer 423 can be higher than that in the case of using an amorphous oxide semiconductor layer; therefore, the resistance between the source electrode 424a and the drain electrode 424b can be reduced.

By reducing the resistance between the source electrode 424a and the drain electrode 424b, a high on-state current and high-speed operation can be ensured even when the transistor 421 is miniaturized. By miniaturization of the transistor 421, the area of a memory cell array including the transistor can be reduced, so that memory capacity per unit area can be increased.

Figure 12C:
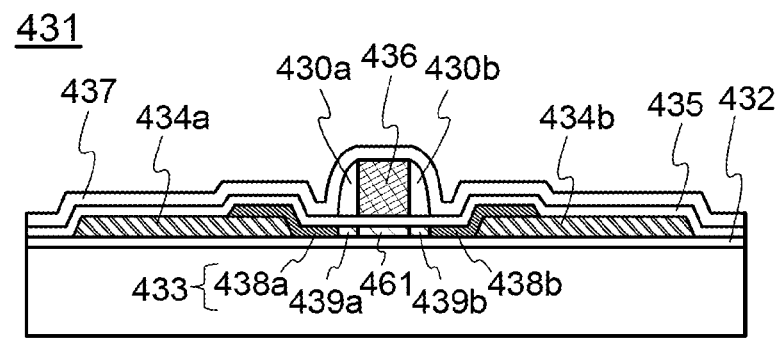

A transistor 431 illustrated in FIG. 12C includes a source electrode 434a and a drain electrode 434b which are formed over a base layer 432, an oxide semiconductor layer 433 which is formed over the source electrode 434a and the drain electrode 434b and functions as an activation layer, a gate insulating layer 435 over the oxide semiconductor layer 433, the source electrode 434a, and the drain electrode 434b, a gate electrode 436 provided over the gate insulating layer 435 so as to overlap with the oxide semiconductor layer 433, and a protective insulating layer 437 provided over the gate electrode 436 and covering the oxide semiconductor layer 433. The transistor 431 further includes sidewalls 430a and 430b provided on side surfaces of the gate electrode 436 and formed using an insulating layer.

The transistor 431 illustrated in FIG. 12C has a top-gate structure where the gate electrode 436 is formed over the oxide semiconductor layer 433, and has a bottom-contact structure where the source electrode 434a and the drain electrode 434b are formed below the oxide semiconductor layer 433. In addition, as in the transistor 411, the gate electrode 436 do not overlap with the source electrode 434a nor the drain electrode 434b in the transistor 431; thus, parasitic capacitances between the gate electrode 436 and the source electrode 434a and between the gate electrode 436 and the drain electrode 434b can be made low, so that high-speed operation can be achieved.

The oxide semiconductor layer 433 includes a pair of high-concentration dopant regions 438a and 438b and a pair of low-concentration dopant regions 439a and 439b which are obtained by addition of dopants imparting n-type conductivity to the oxide semiconductor layer 433 after formation of the gate electrode 436. Further, in the oxide semiconductor layer 433, a region with which the gate electrode 436 overlaps with the gate insulating layer 435 laid therebetween is a channel formation region 461. In the oxide semiconductor layer 433, the pair of low-concentration dopant regions 439a and 439b are provided between the pair of high-concentration dopant regions 438a and 438b, and the channel formation region 461 is provided between the pair of low-concentration dopant regions 439a and 439b. The pair of low-concentration dopant regions 439a and 439b are provided in regions which are included in the oxide semiconductor layer 433 and overlap with the sidewalls 430a and 430b with the gate insulating layer 435 laid therebetween.

Similarly to the dopant regions 418a and 418b included in the transistor 411, the high-concentration dopant regions 438a and 438b and the low-concentration dopant regions 439a and 439b can be formed by an ion implantation method. The description of the dopant regions 438a and 438b can be referred to for the kind of the dopant for forming the high-concentration dopant regions 418a and 418b.

For example, in the case where nitrogen is used as the dopant, the concentration of nitrogen atoms in the high-concentration dopant regions 438a and 438b is preferably higher than or equal to $5 \times 10^{19}/cm^3$ and lower than or equal to $1 \times 10^{22}/cm^3$. Further, for example, in the case where nitrogen is used as the dopant, the concentration of nitrogen atoms in the low-concentration dopant regions 439a and 439b is preferably higher than or equal to $5 \times 10^{18}/cm^3$ and lower than or equal to $5 \times 10^{19}/cm^3$.

The high-concentration dopant regions 438a and 438b to which the dopant imparting n-type conductivity is added have higher conductivity than the other regions in the oxide semiconductor layer 433. Therefore, by providing the high-concentration dopant regions 438a and 438b in the oxide semiconductor layer 433, the resistance between the source electrode 434a and the drain electrode 434b can be decreased. Further, the low-concentration dopant regions 439a and 439b are provided between the channel formation region 461 and the high-concentration dopant regions 438a and 438b, which results in a reduction in negative shift of a threshold voltage due to a short-channel effect.

In the case where an In—Ga—Zn-based oxide semiconductor is used for the oxide semiconductor layer 433, heat treatment is performed at a temperature higher than or equal to 300° C. and lower than or equal to 600° C. after nitrogen is added. Consequently, the oxide semiconductor in the high-concentration dopant regions 438a and 438b has a wurtzite crystal structure. Further, depending on the nitrogen concentration, the low-concentration dopant regions 439a and 439b also have a wurtzite crystal structure due to the heat treatment. When the oxide semiconductor in the source electrode 434a and the drain electrode 434b has a wurtzite crystal structure, the conductivity of the high-concentration dopant regions 438a and 438b can be further increased and the resistance between the source electrode 434a and the drain electrode 434b can be decreased. Note that in order to effectively decrease the resistance between the source electrode 434a and the drain electrode 434b by forming the oxide semiconductor having a wurtzite crystal structure, when nitrogen is used as a dopant, the nitrogen atom concentration in the high-concentration dopant regions 438a and 438b is preferably higher than or equal to $1 \times 10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor layer 433 may be a CAAC-OS layer. When the oxide semiconductor layer 433 is a CAAC-OS layer, the conductivity of the oxide semiconductor layer 433 can be higher than that in the case of using an amorphous oxide semiconductor layer; therefore, the resistance between the source electrode 434a and the drain electrode 434b can be reduced.

By reducing the resistance between the source electrode 434a and the drain electrode 434b, a high on-state current and high-speed operation can be ensured even when the transistor 431 is miniaturized. In addition, by miniaturization of the transistor 431, the area of a semiconductor device including the transistor can be reduced, so that the number of transistors per unit area can be increased.

As one of methods for forming high-concentration dopant regions functioning as a source and drain regions in a transistor using an oxide semiconductor in a self-aligned manner, a method is disclosed in which a surface of an oxide semiconductor layer is exposed and argon plasma treatment is performed thereon to reduce resistance of the region in the oxide semiconductor layer which is exposed to plasma (S. Jeon et al. "180 nm Gate Length Amorphous InGaZnO Thin Film Transistor for High Density Image Sensor Applications", *IEDM Tech. Dig.*, pp. 504-507, 2010).

However, in the above manufacturing method, it is necessary to remove the gate insulating layer partly so that portions to be a source region and a drain region are exposed after the gate insulating layer is formed. Thus, when the gate insulating layer is removed, the oxide semiconductor layer placed below the gate insulating layer is also partly over-etched; therefore, the thickness of the portions to be a source region and a drain region is reduced. Consequently, the resistance of the source or drain region is increased, and defects in characteristics of the transistor due to over-etching tends to be triggered.

For further miniaturization of a transistor, it is suitable to adopt a dry-etching method with high process accuracy. However, the above over-etching is likely to occur remarkably in the case of employing a dry etching method by which the selectivity of the oxide semiconductor layer with respect to the gate insulating layer cannot be secured sufficiently.

For example, the problem of over-etching does not arise when the oxide semiconductor layer has a sufficient thickness. However, when the channel length is to be shorter than or equal to 200 nm, the thickness of the portion of the oxide semiconductor layer to be a channel formation region needs to be less than or equal to 20 nm, preferably less than or equal to 10 nm so as to prevent short-channel effect. When the thickness of the oxide semiconductor layer is small as in the above case, the resistance of the source region or the drain region is increased and defective characteristics of the transistor occur due to over-etching of the oxide semiconductor layer as described above, which is not preferable.

However, as in one embodiment of the present invention, addition of dopant to an oxide semiconductor layer is performed in the state where a gate insulating layer is left so as not to expose the oxide semiconductor; thus, the over-etching of the oxide semiconductor layer can be prevented and excessive damage to the oxide semiconductor layer can be reduced. In addition, the interface between the oxide semiconductor layer and the gate insulating layer is kept clean. Accordingly, the characteristics and reliability of the transistor can be improved.

A base layer positioned below the oxide semiconductor layer or a protective insulating layer positioned above the oxide semiconductor layer is preferably formed using a material that has a high barrier property against an alkali metal, hydrogen, and oxygen. For example, for the insulating layer having a high barrier property, silicon nitride, silicon nitride oxide, aluminum nitride, aluminum oxide, aluminum oxide nitride, or aluminum nitride oxide can be used. As the base layer and the protective insulating layer, a single layer or a stack of layers of the insulating layer having a high barrier property, or a stack of layers of the insulating layer having a high barrier property and the insulating layer having a low barrier property may be used.

Covering the oxide semiconductor layer with an insulating layer having a high barrier property can prevent entry of impurities from the outside and oxygen from releasing from the oxide semiconductor layer. Therefore, reliability of the transistor can be improved.

Figure 12D:
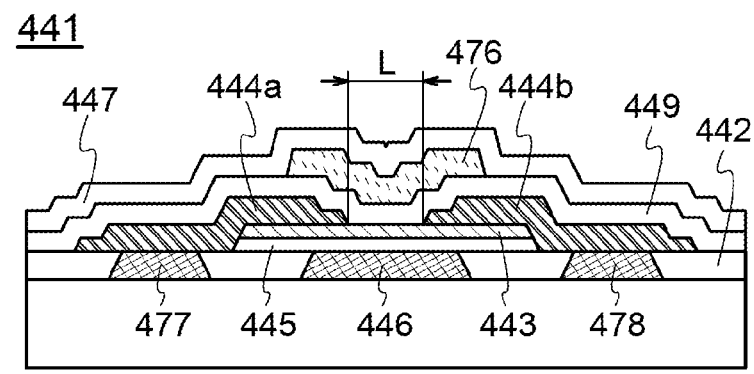

A transistor 441 illustrated in FIG. 12D has a structure in which a gate electrode 446, an electrode 477, and an electrode 478 are embedded in an insulating layer 442. Such a structure can be obtained in such a manner that the insulating layer 442 is formed over the gate electrode 446, the electrode 477, and the electrode 478 and then the top surfaces of the electrodes are exposed by CMP treatment or etching treatment. Alternatively, the top surfaces of the gate electrode 446, the electrode 477, and the electrode 478 may be exposed by a combination of CMP treatment and etching treatment.

The transistor 441 includes a gate insulating layer 445 which is formed over the gate electrode 446, an oxide semiconductor layer 443 which is formed over the gate insulating layer 445, and a source electrode 444a and a drain electrode 444b which are formed over the oxide semiconductor layer 443. End portions of the source electrode 444a and the drain electrode 444b are processed to have a step shape. The transistor 441 further includes an insulating layer 449 which is in contact with part of the oxide semiconductor layer 443 and is provided over the source electrode 444a and the drain electrode 444b, an electrode 476 which is formed over the insulating layer 449, and a protective insulating layer 447 which is formed over the electrode 476.

The transistor 441 illustrated in FIG. 12D has a bottom-gate structure where the gate electrode 446 is formed below the oxide semiconductor layer 443, and has a bottom-contact structure where the source electrode 444a and the drain electrode 444b are formed below the oxide semiconductor layer 443. The channel length (L) of the transistor 441 is determined by a distance between the source electrode 444a and the drain electrode 444b which are in contact with the oxide semiconductor layer 443.

Further, the gate insulating layer 445 and the insulating layer 449 which are in contact with the oxide semiconductor layer 443 preferably contain a large amount of oxygen.

The electrode 476 can be formed using a material and a method similar to those of the gate electrode 446, the source electrode 444a, and the drain electrode 444b. The electrode 476 is provided to overlap with the gate electrode 446 with the channel formation region in the oxide semiconductor layer 443 laid therebetween. The electrode 476 may be electrically connected to one of the source electrode 444a and the drain electrode 444b or electrically connected to the gate electrode 446. Alternatively, the electrode 476 may be connected nowhere and electrically floating (in a floating state). The placement of the electrode 476 can reduce variations in characteristics of a plurality of transistors which are caused when the transistors are formed in the semiconductor device, and achieve high stability in operation of the semiconductor device.

The electrode 476 can also serve as a back gate electrode. In general, the back gate electrode is positioned so that the channel formation region of the semiconductor layer is interposed between the gate electrode and the back gate electrode. The back gate electrode is formed using a conductive layer and can function in a manner similar to that of the gate electrode. The electrode 476 is provided to overlap with the gate electrode 446 with the channel formation region in the oxide semiconductor layer 443 laid therebetween, thereby being capable of serving as a back gate electrode. Accordingly, the electrode 476 can function like the gate electrode 446. By changing a potential of the electrode 476 independently of the potential of the gate electrode 446, the threshold voltage of the transistor can be changed. Alternatively, it is possible to use the electrode 476 as a gate electrode and use the gate electrode 446 as a back gate electrode.

The methods and structures described in one of this embodiment can be combined as appropriate with any of the methods and structures described in the other embodiments.

Embodiment 5

In this embodiment, a structure of a signal processing circuit including any of the memory devices described in the above embodiments will be described.

Figure 13:
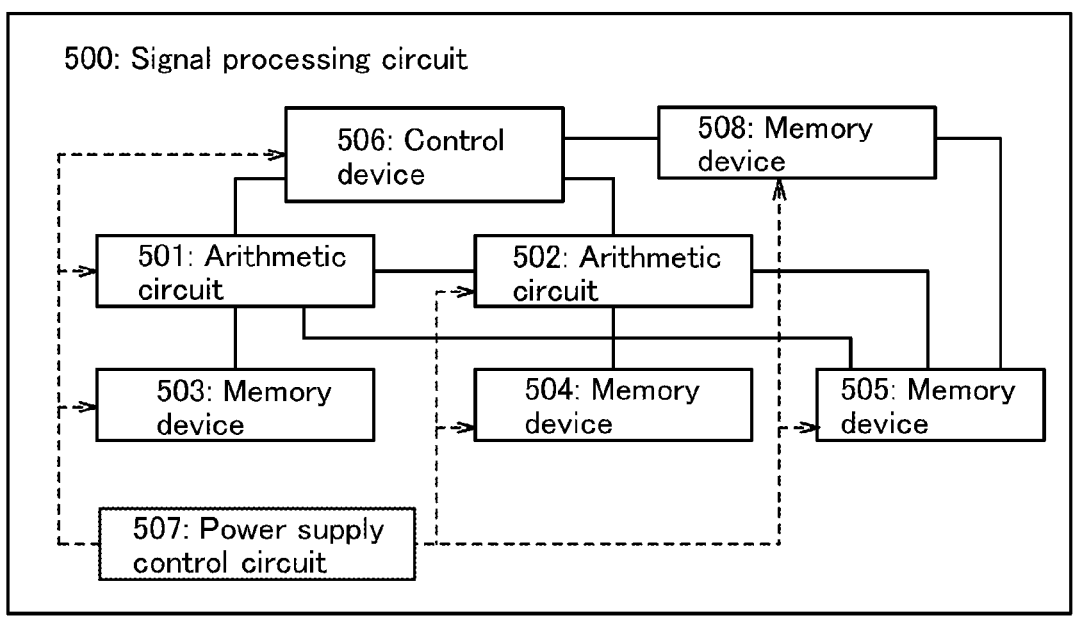
FIG. 13 illustrates a signal processing device.

FIG. 13 illustrates an example of a signal processing circuit according to one embodiment of the present invention. The signal processing circuit at least includes one or a plurality of arithmetic circuits and one or a plurality of memory devices. Specifically, a signal processing circuit 500 illustrated in FIG. 13 includes an arithmetic circuit 501, an arithmetic circuit 502, a memory device 503, a memory device 504, a memory device 505, a control device 506, a power supply control circuit 507, and a memory device 508.

The arithmetic circuits 501 and 502 each include, as well as a logic circuit which carries out simple logic arithmetic processing, an adder, a multiplier, and various arithmetic circuits. The memory device 503 functions as a register for temporarily holding data when the arithmetic processing is carried out in the arithmetic circuit 501. The memory device 504 functions as a register for temporarily holding data when the arithmetic processing is carried out in the arithmetic circuit 502.

In addition, the memory device 505 can be used as a main memory and can store a program executed by the control device 506 as data or can store data from the arithmetic circuit 501 and the arithmetic circuit 502.

The control device 506 is a circuit which collectively controls operations of the arithmetic circuit 501, the arithmetic circuit 502, the memory device 503, the memory device 504, the memory device 505, and the memory device 508 included in the signal processing circuit 500. Note that in FIG. 13, a structure in which the control device 506 is provided in the signal processing circuit 500 as a part thereof is illustrated, but the control device 506 may be provided outside the signal processing circuit 500.

In addition, as well as the supply of power to the memory device, the supply of the power to the control circuit or the arithmetic circuit which transmits/receives data to/from the memory device may be stopped. For example, when the arithmetic circuit 501 and the memory device 503 are not operated, the supply of power to the arithmetic circuit 501 and the memory device 503 may be stopped.

In addition, the power supply control circuit 507 controls the amount of power which is supplied to the arithmetic circuit 501, the arithmetic circuit 502, the memory device 503, the memory device 504, the memory device 505, the control device 506, and the memory device 508 included in the signal processing circuit 500. Further, in the case where the supply of power is stopped, a switching element for stopping the supply of power may be provided for the power supply control circuit 507, or for each of the arithmetic circuit 501, the arithmetic circuit 502, the memory device 503, the memory device 504, the memory device 505, the control device 506, and the memory device 508. In the latter case, the power supply control circuit 507 is not necessarily provided in the signal processing circuit according to one embodiment of the present invention.

The memory device 508 which functions as a cache memory is preferably provided between the memory device 505 that is a main memory and the control device 506. By providing the cache memory, access to the low-speed main memory can be reduced and the speed of the signal processing such as arithmetic processing can be higher.

When a memory device according to one embodiment of the present invention is used as each of the memory devices 503, 504, and 508, data of the memory device can be held even when the supply of power is stopped for a short time. Further, data held in the memory device is not necessarily transferred to an external non-volatile memory device; therefore, the supply of power can be stopped for a short time. Furthermore, after the supply of power is restarted, data held in the memory device can be restored to a state before the supply of power stopped, in a short time. The use of the above-described memory device 503, memory device 504, and memory device 508 for the signal processing circuit 500 enables the supply of power to be easily stopped for a short time, and power consumption can be reduced.

The methods and structures described in this embodiment can be combined as appropriate with any of the methods and structures described in the other embodiments.

Embodiment 6

A memory element, a memory device, or a signal processing circuit according to one embodiment of the present invention can be applied to a variety of electronic devices (including amusement machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of an electronic device including the memory element, the memory device, or the signal processing circuit according to one embodiment of the present invention described in the above embodiment will be described below.

Figure 14A:
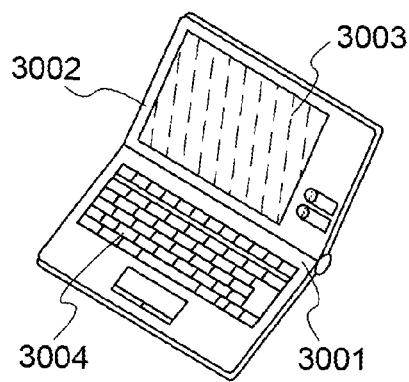
FIGS. 14A to 14F illustrate electronic devices.

FIG. 14A illustrates a laptop personal computer which includes a main body 3001, a housing 3002, a display portion 3003, a keyboard 3004, and the like. The housing 3002 includes a memory element, a memory device, or a signal processing circuit according to one embodiment of the present invention. Therefore, the supply of power can be stopped as necessary. In the memory device or the signal processing circuit according to one embodiment of the present invention, the operation for stopping the supply of power and the operation for resuming the supply of power can be performed at high speed; therefore, the supply of power can be stopped for a short time. Accordingly, power consumption of a laptop personal computer can be efficiently reduced.

Figure 14B:
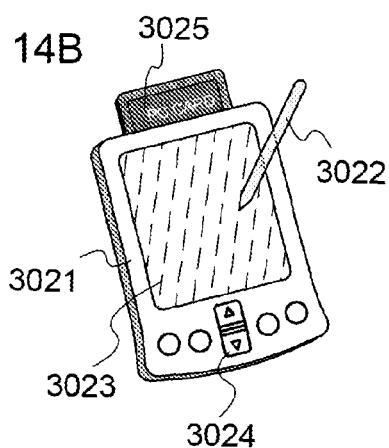

FIG. 14B is a personal digital assistant (PDA) which includes a main body 3021 provided with a display portion 3023, an external interface 3025, operation buttons 3024, and the like. A stylus 3022 is included as an accessory for operation. The main body 3021 includes a memory element, a memory device, or a signal processing circuit according to one embodiment of the present invention. Therefore, the supply of power can be stopped as necessary. In the memory device or the signal processing circuit according to one embodiment of the present invention, the operation for stopping the supply of power and the operation for resuming the supply of power can be performed at high speed; therefore, the supply of power can be stopped for a short time. Accordingly, power consumption of a personal digital assistant can be efficiently reduced.

Figure 14C:
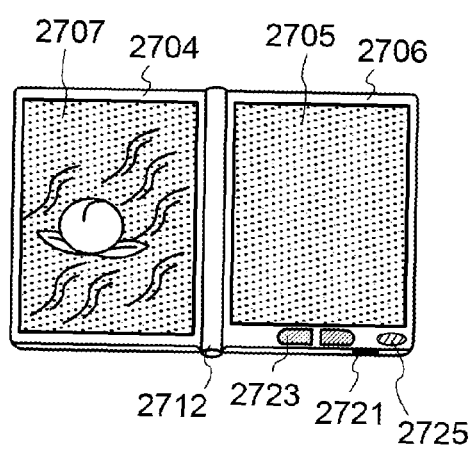

FIG. 14C shows an example of an e-book reader. For example, the e-book reader includes two housings, a housing 2706 and a housing 2704. The housing 2706 is combined with the housing 2704 by a hinge 2712, so that the e-book reader can be opened and closed using the hinge 2712 as an axis. With such a structure, the e-book reader can operate like a paper book.

A display portion 2705 and a display portion 2707 are incorporated in the housing 2706 and the housing 2704, respectively. The display portion 2705 and the display portion 2707 may display one image or different images. In the structure where different images are displayed on different display portions, for example, the right display portion (the display portion 2705 in FIG. 14C) displays text and the left display portion (the display portion 2707 in FIG. 14C) displays images. At least one of the housings 2704 and 2706 includes a memory element, a memory device, or a signal processing circuit according to one embodiment of the present invention. Therefore, the supply of power can be stopped as necessary. In the memory device or the signal processing circuit according to one embodiment of the present invention, the operation for stopping the supply of power and the operation for resuming the supply of power can be performed at high speed; therefore, the supply of power can be stopped for a short time. Accordingly, power consumption of an e-book reader can be efficiently reduced.

FIG. 14C illustrates an example in which the housing 2706 is provided with an operation portion and the like. For example, the housing 2706 is provided with a power supply terminal 2721, operation keys 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the electronic book device may have a function of an electronic dictionary.

The electronic book device may transmit and receive data wirelessly. Through wireless communication, desired book data or the like can be purchased and downloaded from an electronic book server.

Figure 14D:
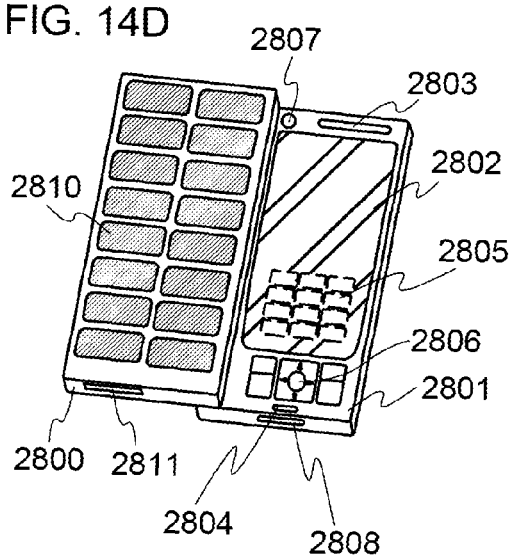

FIG. 14D illustrates a mobile phone, which includes two housings, i.e., a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. Further, an antenna is incorporated in the housing 2801. At least one of the housings 2800 and 2801 includes a memory element, a memory device, or a signal processing circuit according to one embodiment of the present invention. Therefore, the supply of power can be stopped as necessary. In the memory device or the signal processing circuit according to one embodiment of the present invention, the operation for stopping the supply of power and the operation for resuming the supply of power can be performed at high speed; therefore, the supply of power can be stopped for a short time. Accordingly, power consumption of a mobile phone can be efficiently reduced.

Further, the display panel 2802 is provided with a touch panel. A plurality of operation keys 2805 which is displayed as images is illustrated by dashed lines in FIG. 14D. Note that a boosting circuit by which a voltage output from the solar cell 2810 is increased to be sufficiently high for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 14D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 14E:
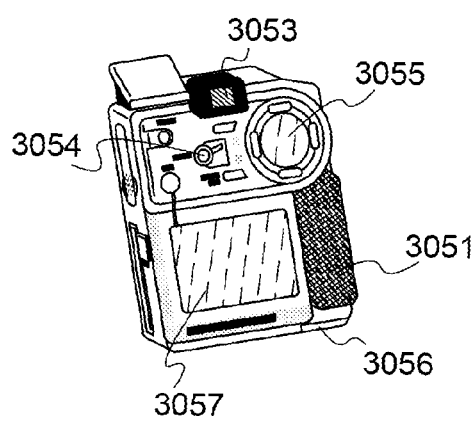

FIG. 14E illustrates a digital video camera which includes a main body 3051, a display portion A 3057, an eyepiece portion 3053, an operation switch 3054, a display portion B 3055, a battery 3056, and the like. The main body 3051 includes a memory element, a memory device, or a signal processing circuit according to one embodiment of the present invention. Therefore, the supply of power can be stopped as necessary. In the memory device or the signal processing circuit according to one embodiment of the present invention, the operation for stopping the supply of power and the operation for resuming the supply of power can be performed at high speed; therefore, the supply of power can be stopped for a short time. Accordingly, power consumption of a digital video camera can be efficiently reduced.

Figure 14F:
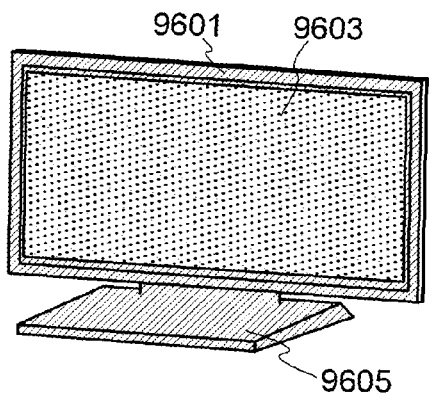

FIG. 14F illustrates an example of a television set. In the television set, a display portion 9603 is incorporated in a housing 9601. The display portion 9603 can display images. Here, the housing 9601 is supported by a stand 9605. The housing 9601 includes a memory element, a memory device, or a signal processing circuit according to one embodiment of the present invention. Therefore, the supply of power can be stopped as necessary. In the memory device or the signal processing circuit according to one embodiment of the present invention, the operation for stopping the supply of power and the operation for resuming the supply of power can be performed at high speed; therefore, the supply of power can be stopped for a short time. Accordingly, power consumption of a television set can be efficiently reduced.

The television set can be operated by an operation switch of the housing 9601 or a separate remote controller. Further, the remote controller may be provided with a display portion for displaying data output from the remote controller.

Note that the television device is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

The methods and structures described in this embodiment can be combined as appropriate with any of the methods and structures described in the other embodiments.

This application is based on Japanese Patent Application serial No. 2012-119709 filed with Japan Patent Office on May 25, 2012, the entire contents of which are hereby incorporated by reference.

What is claimed is:

1. A method for driving a memory element comprising a logic circuit configured to hold different potentials in a first node and a second node; a first memory circuit comprising a first transistor and a first capacitor; and a second memory circuit comprising a second transistor and a second capacitor,
    wherein the first transistor and the second transistor each include indium in a semiconductor layer in which a channel is formed,
    wherein one of a source and a drain of the first transistor is connected to the first node,
    wherein the other of the source and the drain of the first transistor and one electrode of the first capacitor are connected to a third node,
    wherein one of a source and a drain of the second transistor is connected to the second node,
    wherein the other of the source and the drain of the second transistor and one electrode of the second capacitor are connected to a fourth node,
    wherein a gate of the first transistor and a gate of the second transistor are connected to a first wiring, and
    wherein the other electrode of the first capacitor and the other electrode of the second capacitor are connected to a second wiring, the method for driving the memory element comprising the steps of:
        supplying a first bias potential to the second wiring in a first period;
        supplying a potential at which the first transistor and the second transistor are turned on to the first wiring to supply a potential of the first node to the third node and supply a potential of the second node to the fourth node, in the first period, wherein the potential at which the first transistor and the second transistor are turned on has an opposite polarity to the first bias potential;
        supplying a potential at which the first transistor and the second transistor are turned off to the first wiring, and then supplying a second bias potential to the second wiring in a second period; and
        stopping supply of power to the logic circuit in a third period.

2. The method for driving the memory element according to claim 1, wherein the first transistor and the second transistor each include an oxide semiconductor in the semiconductor layer in which the channel is formed.

3. The method for driving the memory element according to claim 1, wherein the first bias potential is lower than the second bias potential.

4. The method for driving the memory element according to claim 1, wherein the logic circuit includes an inverter circuit.

5. The method for driving the memory element according to claim 1, wherein a first power source potential and a second power source potential are supplied to the logic circuit in the first period and the second period.

6. The method for driving the memory element according to claim 5, wherein the first power source potential and the second power source potential are equal to each other to stop supply of power to the logic circuit in the third period.

7. The method for driving the memory element according to claim 6, wherein the first power source potential, the second power source potential, a potential of the first wiring, and a potential of the second wiring are equal to one another in the third period.

8. The method for driving the memory element according to claim 1, wherein the first transistor and the second transistor are enhancement-mode transistors.

9. A method for driving a memory element comprising a logic circuit configured to hold different potentials in a first node and a second node; a first memory circuit comprising a first transistor and a first capacitor; a second memory circuit comprising a second transistor and a second capacitor,
    wherein the first transistor and the second transistor each include indium in a semiconductor layer in which a channel is formed,
    wherein one of a source and a drain of the first transistor is connected to the first node,
    wherein the other of the source and the drain of the first transistor and one electrode of the first capacitor are connected to a third node,
    wherein one of a source and a drain of the second transistor is connected to the second node,
    wherein the other of the source and the drain of the second transistor and one electrode of the second capacitor are connected to a fourth node,
    wherein a gate of the first transistor and a gate of the second transistor are connected to a first wiring, and
    wherein the other electrode of the first capacitor and the other electrode of the second capacitor are connected to a second wiring, the method for driving the memory element comprising the steps of:
        supplying a first bias potential to the second wiring in a first period;
        supplying a potential at which the first transistor and the second transistor are turned on to the first wiring to supply a potential of the first node to the third node and supply a potential of the second node to the fourth node, in the first period, wherein the potential at which the first transistor and the second transistor are turned on has an opposite polarity to the first bias potential;

supplying a potential at which the first transistor and the second transistor are turned off to the first wiring, and then supplying a second bias potential to the second wiring in a second period; and stopping supply of power to the logic circuit in a third period, wherein, after a second bias potential is supplied to the second wiring in a state where supply of power to the logic circuit is stopped, a third bias potential is supplied to the second wiring, and then a potential at which the first transistor and the second transistor are turned on is supplied to the first wiring to supply a potential of the third node to the first node and supply a potential of the fourth node to the second node, in a fourth period, and wherein supply of power to the logic circuit is started in a fifth period.

10. The method for driving the memory element according to claim 9, wherein the first transistor and the second transistor each include an oxide semiconductor in the semiconductor layer in which the channel is formed.

11. The method for driving the memory element according to claim 9, wherein the third bias potential is higher than the second bias potential.

12. The method for driving the memory element according to claim 9, wherein a precharge potential is supplied to the first node and the second node before the first transistor and the second transistor are turned on.

13. The method for driving the memory element according to claim 9, wherein the first transistor and the second transistor are enhancement-mode transistors.

* * * * *